(12) United States Patent
Lee et al.

(10) Patent No.: US 7,279,392 B2
(45) Date of Patent: Oct. 9, 2007

(54) THIN FILM STRUCTURE, CAPACITOR, AND METHODS FOR FORMING THE SAME

(75) Inventors: Seung-Hwan Lee, Seoul (KR); Kyoung-Ryul Yoon, Goyang-si (KR); Han-Mei Choi, Seoul (KR); Dae-Sik Choi, Seoul (KR); Ki-Yeon Park, Seoul (KR); Sung-Tae Kim, Seoul (KR); Young-Sun Kim, Suwon-si (KR); Cha-Young Yoo, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 11 days.

(21) Appl. No.: 11/046,876

(22) Filed: Feb. 1, 2005

(65) Prior Publication Data

US 2005/0170566 A1    Aug. 4, 2005

Related U.S. Application Data

(63) Continuation-in-part of application No. 10/632,825, filed on Aug. 4, 2003, now Pat. No. 7,151,039.

(30) Foreign Application Priority Data

Nov. 29, 2004   (KR) ............................... 2004-98552

(51) Int. Cl.
  *H01L 21/20*   (2006.01)
  *H01L 29/00*   (2006.01)
(52) U.S. Cl. ................ 438/396; 438/591; 438/778; 257/532; 257/E29.343

(58) Field of Classification Search ............ 438/396, 438/591, 778; 257/532
See application file for complete search history.

(56) References Cited

U.S. PATENT DOCUMENTS

| 6,348,386 | B1 | 2/2002 | Gilmer |
| 6,391,803 | B1 | 5/2002 | Kim et al. |
| 6,407,435 | B1 * | 6/2002 | Ma et al. ..................... 257/411 |
| 6,420,279 | B1 | 7/2002 | Ono et al. |
| 6,753,618 | B2 | 6/2004 | Basceri et al. |
| 2002/0190294 | A1 | 12/2002 | Iizuka et al. |
| 2004/0033698 | A1 | 2/2004 | Lee et al. |

FOREIGN PATENT DOCUMENTS

| KR | 10-2001-0082118 | 8/2001 |
| KR | 10-2004-0016779 | 2/2004 |
| KR | 10-2004-0060443 | 7/2004 |
| KR | 1020040084700 | 10/2004 |

* cited by examiner

*Primary Examiner*—Evan Pert
(74) *Attorney, Agent, or Firm*—Harness, Dickey & Pierce, P.L.C.

(57) ABSTRACT

A thin film structure and a capacitor using the film structure and methods for forming the same. The thin film structure may include a first film formed on a substrate using a first reactant and an oxidant for oxidizing the first reactant. A second film may be formed on the first film to suppress crystallization of the first film. A capacitor may include a dielectric layer, which may further include the first thin film and the second thin film.

37 Claims, 26 Drawing Sheets

US 7,279,392 B2

THIN FILM STRUCTURE, CAPACITOR, AND METHODS FOR FORMING THE SAME

RELATED APPLICATION

This application claims priority under 35 U.S.C. § 119 from Korean Patent Application No. 2004-98552, filed on Nov. 29, 2004, and is a continuation-in-part application of and claims priority under 35 U.S.C. § 120 of U.S. patent application Ser. No. 10/632,825, filed on Aug. 4, 2003, now U.S. Pat. No. 7,151,039, entitled "METHOD OF FORMING OXIDE LAYER USING ATOMIC LAYER DEPOSITION METHOD AND METHOD OF FORMING CAPACITOR OF SEMICONDUCTOR DEVICE USING THE SAME", which further claims priority under 35 U.S.C. § 119 from Korean Patent Application No. 2002-48720, filed on Aug. 17, 2002, all of which are hereby incorporated by the reference in their entirety.

BACKGROUND OF THE INVENTION

1. Field of the Invention

Example embodiments of the present invention relate to thin film structures, capacitors and methods of forming the same.

2. Description of the Related Art

A material having a higher dielectric constant may be used for a gate insulation layer of, for example, a metal oxide semiconductor (MOS) transistor or a dielectric layer of a capacitor. A higher dielectric constant may have a thin equivalent oxide thickness (ETO) and may more efficiently reduce a leakage current generated between a gate electrode and a channel region or between a lower electrode and an upper electrode. Zirconium oxide ($ZrO_2$), for example, may be used as the material having the higher dielectric constant. For example, a method of forming a film including zirconium oxide may use tetrakis-methyl ethyl amino zirconium (TEMAZ; $Zr[N(CH_3)(C_2H_5)]_4$) and a method of forming a zirconium oxide film for a dielectric layer of a capacitor may use zirconium chloride ($ZrCl_4$).

A multi-layered structure, which may include a zirconium oxide, may be used for a dielectric layer of a capacitor. A dielectric layer of a capacitor may include an aluminum oxide film and an oxide film or a composite film formed on the aluminum oxide film. The oxide film may include tantalum oxide, zirconium oxide or hafnium oxide, and the composite film may include hafnium-aluminum oxide or lanthanum-aluminum oxide.

In an alternative, a dielectric layer of a capacitor may include a silicate interface film and a higher dielectric film formed on the silicate interface film. The higher dielectric film may include a hafnium oxide film, a zirconium oxide film, a tantalum oxide film, an aluminum oxide film, a titanium oxide film, an yttrium oxide film, a barium-strontium-titanium oxide (BST) film, a plumbum-zirconate-titanate (PZT) film. In another alternative, a dielectric layer of a capacitor may include a silicon oxide film, a silicon nitride film, an aluminum oxide film, a tantalum oxide film, a titanium oxide film, a hafnium oxide film, a zirconium oxide film, a BST film or a PZT film.

The energy band gaps and dielectric constants of oxides such as $Ta_2O_5$, $Y_2O_3$, $HfO_2$, $ZrO_2$, $Nb_2O_5$, $BaTiO_3$ and $SrTiO_3$, which may be used as dielectric materials, are graphically illustrated in FIG. 1.

SUMMARY OF THE INVENTION

Exemplary embodiments of the present invention provide a thin film structure, a capacitor, and methods of forming the same.

An example embodiment of the present invention may provide a method of forming a thin film structure. At least one first thin film including a metal oxide material may be formed on a substrate using a first reactant including a precursor and using a first oxidant for oxidizing the first reactant. At least one second thin film, which may be a metal oxide material, may be formed on the at least one first thin film, and may suppress crystallization of the first thin film.

Another example embodiment of the present invention may provide a method of forming a capacitor. A lower electrode may be formed on a substrate, and a dielectric layer may be formed on the lower electrode. The dielectric layer may include at least one first thin film and at least one second thin film, which may suppress crystallization of the at least one first thin film. An upper electrode may be formed on the dielectric layer to form the capacitor.

Another example embodiment of the present invention may provide a thin film structure. The example embodiment of the thin film structure may include at least one first thin film and at least one second thin film. The at least one first thin film may include a metal oxide material formed on a substrate. The at least one second thin film may be formed on the at least one first thin film, and the second thin film may be adapted to suppress crystallization of the first thin film.

Another example embodiment of the present invention may provide a capacitor. The example embodiment of the capacitor may include a lower electrode formed on a substrate. A dielectric layer may be formed on the lower electrode, and may include at least one first thin film and at least one second thin film. The at least one second thin film may be adapted to suppress crystallization of the at least one first thin film. An upper electrode may be formed on the dielectric layer to form the capacitor.

In example embodiments of the present invention, the metal oxide material may be zirconium oxide, and the precursor may be a zirconium precursor.

In example embodiments of the present invention, the first reactant may be provided on the substrate, and may include at least one of tetrakis-methyl ethyl amino zirconium (TEMAZ) and zirconium butyl oxide. A first portion of the first reactant may be chemisorbed to the substrate and a second portion of the first reactant may be physically absorbed to the chemisorbed first portion of the first reactant. The second portion of the first reactant may be removed. The first oxidant may be provided on the substrate, and may include at least one of an ozone ($O_3$) gas, an oxygen ($O_2$) gas, a water ($H_2O$) vapor, an oxygen plasma and a remote oxygen plasma. The first metal oxide material may be formed on the substrate by chemically reacting the first portion of the first reactant with the first oxidant, and an unreacted first oxidant may be removed. The providing, chemisorbing, physically absorbing, removing, providing, forming and removing may be repeated at least once.

In example embodiments of the present invention, the at least one second thin film may include at least one of hafnium oxide and aluminum oxide.

In example embodiments of the present invention, the at least one second thin film may include hafnium oxide. A second reactant may be provided on the first thin film, and may include at least one of tetrakis-ethyl methyl amino hafnium and hafnium butyl oxide. A first portion of the second reactant may be chemisorbed to the first film, and a second portion of the second reactant may be physically absorbed to the first portion of the second reactant. The second portion of the second reactant may be removed, and a second oxidant may be provided on the substrate. The second oxidant may include at least one of an ozone ($O_3$) gas, an oxygen ($O_2$) gas, a water ($H_2O$) vapor, an oxygen plasma and a remote oxygen plasma. The second metal oxide material may be formed, and an unreacted second oxidant may be removed. The providing, chemisorbing, physically absorbing, removing, providing, forming and removing may be repeated at least once.

In example embodiments of the present invention, the at least one first thin film or the at least one second thin film may be formed at a temperature of about 200° C. to about 400° C., inclusive, and/or a pressure of about 0.1 Torr to about 3.0 Torr, inclusive.

In example embodiments of the present invention, the at least one second thin film may include aluminum oxide, and a second reactant may be provided on the at least one first thin film. The second material may include trimethyl aluminum (TMA). A first portion of the second reactant may be chemisorbed to the first film and a second portion of the second reactant may be physically absorbed to the chemisorbed first portion of the second reactant. The second portion of the second reactant may be removed, and a second oxidant may be provided on the substrate. The second oxidant may include at least one of an ozone ($O_3$) gas, an oxygen ($O_2$) gas, a water ($H_2O$) vapor, an oxygen plasma and a remote oxygen plasma. The second metal oxide material may be formed on the first thin film, and an unreacted second oxidant may be removed. The providing, chemisorbing, physically absorbing, removing, providing, forming and removing may be repeated at least once.

In example embodiments of the present invention, the thin film structure may have a double-layered structure in which the first thin film may have a first thickness and the second thin film may have a second thickness.

In example embodiments of the present invention, the dielectric layer and/or the thin film structure may have a laminated structure in which a plurality of first thin films and a plurality of second thin films may be alternately stacked.

In example embodiments of the present invention, the dielectric layer and/or the thin film structure may have a structure in which the second thin film may be interposed between two first thin films or the first thin film may be interposed between two second thin films.

In example embodiments of the present invention, a first reactant may be provided on the lower electrode. A first portion of the first reactant may be chemisorbed to the lower electrode and a second portion of the first reactant may be physically absorbed to the chemisorbed first portion of the first reactant. The second portion of the first reactant may be removed and a first oxidant may be provided on the chemisorbed first portion of the first reactant. A first thin film may be formed on the lower electrode by chemically reacting the first oxidant with the chemisorbed first portion of the first reactant, and an unreacted first oxidant may be removed. A second reactant may be provided on the first thin film. A first portion of the second reactant may be chemisorbed to the first thin film and a second portion of the second reactant may be physically absorbed to the chemisorbed first portion of the second reactant. The second portion of the second reactant may be removed, and a second oxidant may be provided on the chemisorbed first portion of the second reactant. A second thin film may be formed on the first thin film by chemically reacting the second oxidant with the chemisorbed first portion of the second reactant, and an unreacted second oxidant may be removed.

In example embodiments of the present invention, the first thin film may have a thickness of about 50 Å to about 150 Å, inclusive, and the second thin film may have a thickness of about 1 Å to about 30 Å, inclusive.

In example embodiments of the present invention, the lower electrode may include titanium nitride, and/or the upper electrode may include titanium nitride.

BRIEF DESCRIPTION OF THE DRAWINGS

Example embodiments of the present invention will become readily apparent along with the following detailed description when considered in conjunction with the accompanying drawings wherein.

DETAILED DESCRIPTION OF THE EXAMPLE EMBODIMENTS OF THE PRESENT INVENTION

Figure 1:
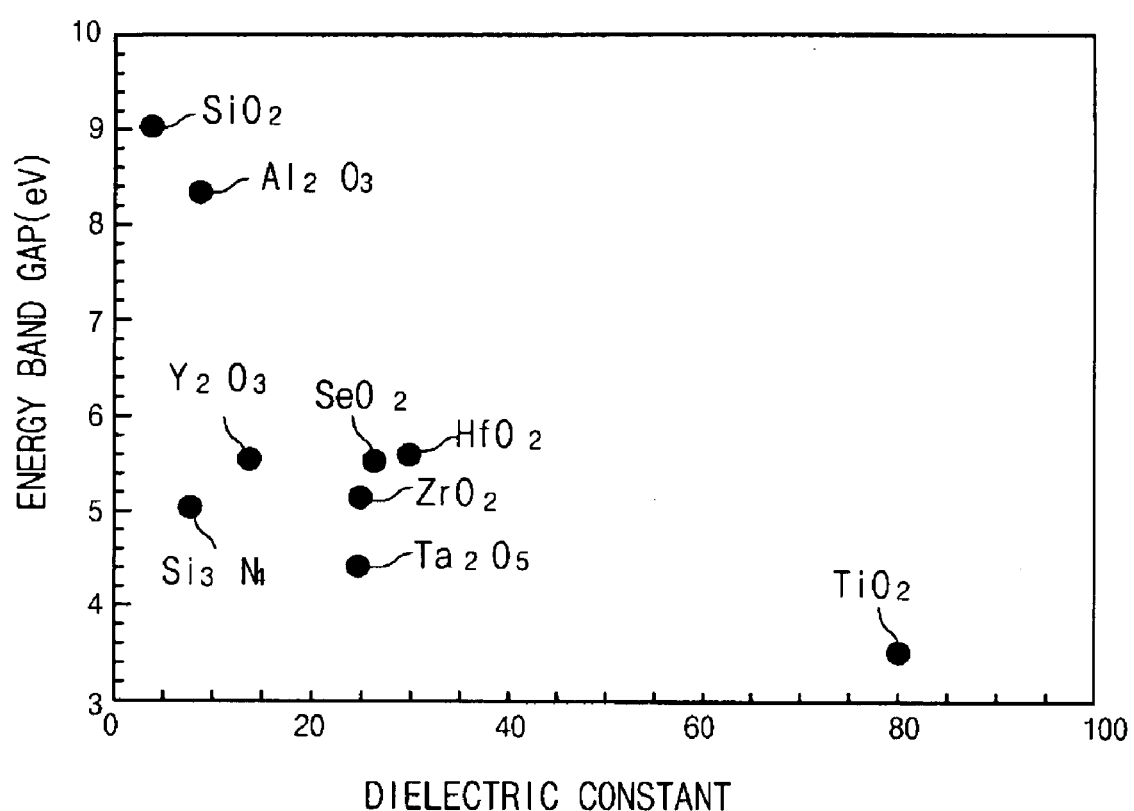
FIG. 1 illustrates the energy band gaps and dielectric constants of various materials.

Example embodiments of the present invention now will be described more fully hereinafter with reference to the accompanying drawings, in which example embodiments of the invention are shown. Example embodiments of the present invention may, however, be embodied in many different forms and should not be construed as limited to the example embodiments set forth herein; rather, these embodiments are provided so that this disclosure will be through and complete, and will fully convey the scope of the invention to those skilled in the art. In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element or intervening elements may also be present.

Figure 2A:
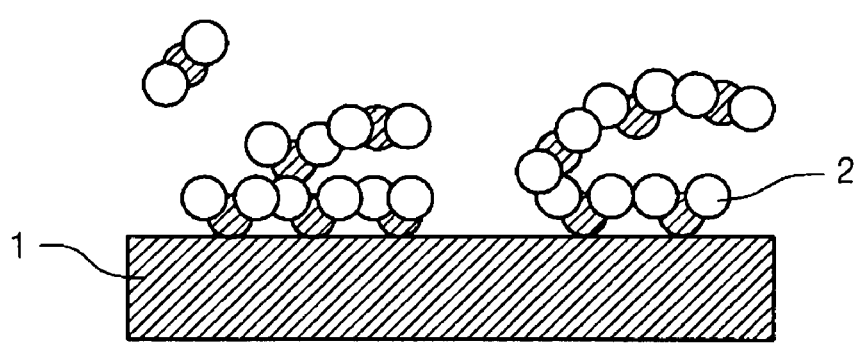
FIGS. 2A-2E are cross-sectional views for explaining a method of forming an oxide layer using an atomic layer deposition (ALD) method according to an exemplary embodiment of the present invention.

FIGS. 2A to 2E are cross-sectional views for explaining an exemplary embodiment of forming an oxide layer using an atomic layer deposition method. As illustrated in FIG. 2A, a substrate 1, such as a silicon wafer, is placed in a chamber in which a temperature of from about 100° C. to about 500° C. is maintained. The pressure of the chamber is controlled to about 0.4 Torr or less. In an exemplary embodiment, the temperature range is from about 150° C. to about 350° C. A precursor containing one central metal or semimetal element and an amino functional group is introduced into the chamber using an inert carrier gas such as argon (Ar) or nitrogen ($N_2$) at a flow rate of about 50-5,000 sccm (standard cubic centimeters per minute) for about 1-3 seconds to form an absorption layer 2 on the substrate. In an exemplary embodiment, the flow rate of the inert gas is in a range of about 500-1,500 sccm.

The precursor includes a compound represented by a chemical formula of $MX_n$, where M represents at least one atom of at least one element from Group 2, 3A including lanthanide, 4A, 5A, 3B, 4B or 5B of the periodic table. In an exemplary embodiment, the element includes at least one element selected from Sr, Ba, Y, La, Ti, Zr, Hf, V, Nb, Ta, Al, Ge, Pb, As, Sn, Si and Bi. In addition, X represents —$NR_1R_2$ wherein $R_1$ and $R_2$ may be the same or different substituents selected from hydrogen and alkyl groups having 1-4 carbon atoms, such as methyl, ethyl, n-propyl, iso-propyl, n-butyl, iso-butyl and tert-butyl groups, and n represents an integer of 2-5.

In an exemplary embodiment, the metal precursor is a hafnium metal compound containing hafnium and an amino functional group. Examples of such metal precursors include TEMAH (tetrakis-ethyl methyl amino hafnium, $Hf[NC_2H_5CH_3]_4$), TDEAH (tetrakis-diethyl amino hafnium, $Hf[N(C_2H_5)_2]_4$), TDMAH (tetrakis-dimethyl amino hafnium, $Hf[N(CH_3)_2]_4$, $Hf[N(C_3H_7)_2]_4$ and $Hf[N(C_4H_9)_2]_4$. These compounds can be used alone or in a mixture. Other suitable precursors include, $Ti[N(CH_3)C_2H_5]_4$, $Zr[N(CH_3)C_2H_5]_4$, $Sn[N(CH_3)C_2H_5]_4$, $Si[N(CH_3)C_2H_5]_4$, $Ta[N(CH_3)C_2H_5]_5$, $Al[N(CH_3)C_2H_5]_3$ and $(CH_3)_2AlNH_2$.

In an exemplary embodiment, a hafnium oxide ($HfO_2$) layer exhibiting good step coverage and a high dielectric constant is formed utilizing an ALD method for forming a thin film.

When the metal precursor is introduced onto the substrate, a portion of the metal precursor is chemisorbed onto the surface portion of the substrate to form a precursor layer while another portion of the metal precursor tends to be physically absorbed (i.e., physisorbed) onto the chemisorbed molecules or present as free molecules within the deposition chamber.

Figure 2B:
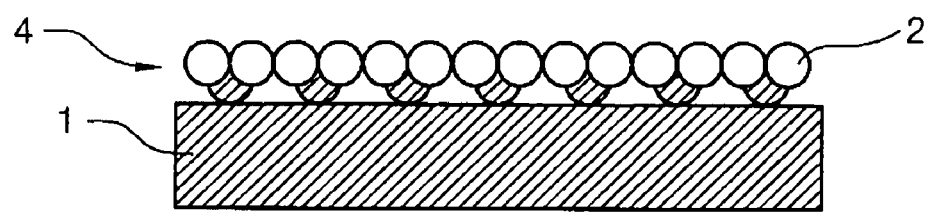

Referring to FIG. 2B, an inert gas such as argon or nitrogen is introduced to remove the portion of the metal precursor that has not been chemisorbed onto the substrate using a purge and/or a vacuum purge process. In an exemplary embodiment, a satisfactory period for maintaining the purge or the vacuum purge process is about 1-20 seconds. In another exemplary embodiment, the time period is 1-4 seconds. During the purge process, the materials that are not chemisorbed are removed from the chamber leaving precursor molecules in the chemical absorption layer 4 on the substrate 1.

Figure 2C:
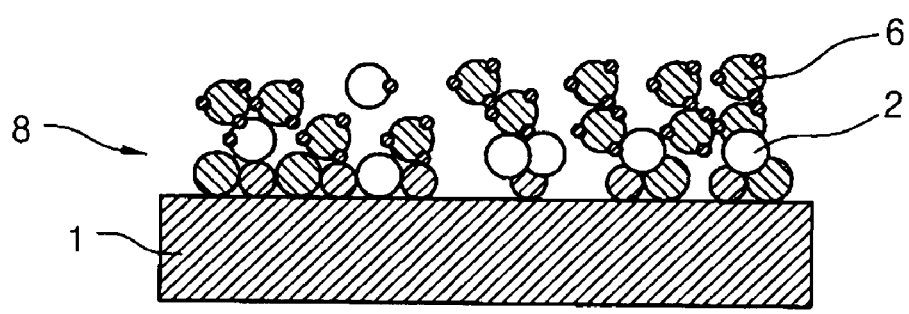

Referring to FIG. 2C, an oxidant 6 is then introduced into the chamber. In an exemplary embodiment, the oxidant is introduced into the chamber at a flow rate of about 500 sccm for about 2-5 seconds. The chemical absorption layer 4 and the oxidant chemically react with each other to form a metal oxide atomic layer 8 on the substrate. For example, the Hf contained in a chemisorbed hafnium precursor layer and oxygen originating from the oxidant can react on the surface of substrate 1 to form an atomic layer of $HfO_2$.

The oxidant may include one or more oxidants including activated oxidants that may produce an oxygen radical as well as oxidants containing a hydroxyl functional group. Examples of activated oxidants include ozone ($O_3$), which may be produced by a plasma generating instrument, plasma $O_2$, remote plasma $O_2$ and plasma $N_2O$. When oxygen gas is treated to form ozone, a portion of the $O_2$ gas is converted into $O_3$ to produce a mixed $O_2/O_3$ stream typically comprising about 5 to 15 mole percent ozone. In addition, exemplary oxidants include those that contain a hydroxyl function group, such as $H_2O$ and $H_2O_2$ and other oxygen containing compounds such as $N_2O$ and $NO_2$.

Figure 2D:
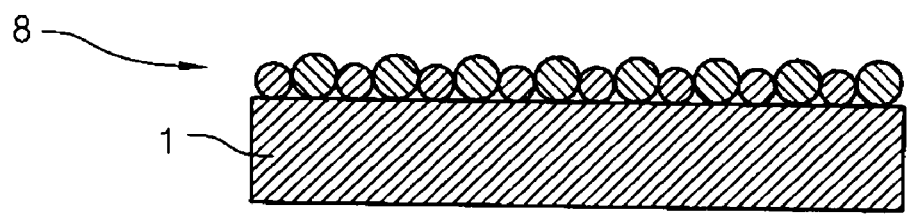

Referring to FIG. 2D, the unreacted oxidant may be removed from the chamber using a purge and/or a vacuum purge process with an inert gas such as argon or nitrogen. In an exemplary embodiment, a satisfactory period for maintaining the purge or the vacuum purge process is about 1-20 seconds. In another exemplary embodiment, the purge time period is 1-4 seconds after forming metal oxide layer 8.

Figure 2E:
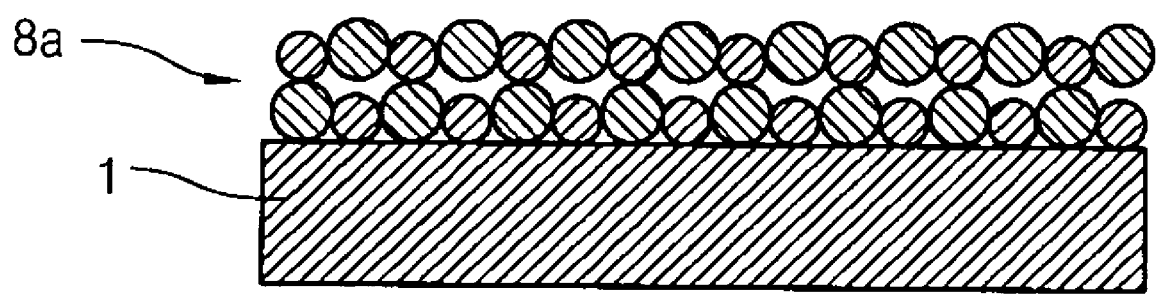

Referring to FIG. 2E, a thicker metal oxide layer 8a having a desired thickness is formed on a substrate 1 by repeating the above-described steps of introducing the metal precursor onto the substrate to form a chemisorbed precursor layer, purging to remove the precursor compounds not included in the chemisorbed precursor layer, introducing an oxidant to oxidize the chemisorbed metal precursor layer and purging the chamber to remove the unreacted oxidant.

During implementing the above-described steps, an exemplary temperature range within the chamber is about 100-500° C. In another exemplary embodiment, the temperature in the chamber is maintained at a temperature of about 150-350° C. Through this temperature control, thermal damage to and/or the thermal budget of underlying layers can be reduced or minimized during the formation of metal oxide layers such as $HfO_2$.

A liquid source of the metal precursor containing an amino functional group utilized in exemplary embodiments of the present invention have a relatively high vapor pressure when comparing with other precursors such as halogen precursors. This indicates that a larger number of metal precursors having an amino functional group will be available for reaction than corresponding halogen precursors at similar deposition conditions. Therefore, when the liquid source including an amino functional group is used as the precursor, a large amount of metal source gas is introduced into the evaporating chamber to increase the number of molecules directly supplied onto the bottom portion of structures having aspect ratios greater than about 1:10 or stepped portions. Accordingly, a thin film having an improved step coverage can be formed by using a metal precursor containing an amino functional group according to exemplary embodiments of the present invention rather than using the conventional halogen precursor. In addition, the thickness and uniformity of the thin metal oxide layer (for instance less than 30 Å) also can be controlled advantageously.

When implementing the step illustrated in FIG. 2C, any oxidant, including both activated oxidants that can produce oxygen radicals and oxidants containing a hydroxyl functional group can be used. In an exemplary embodiment, ozone gas is used in order to form a dielectric layer having improved breakdown resistance characteristics. When $H_2O$ is used as the oxidant, an —OH bond may be created within the metal oxide film resulting in an increased likelihood of forming fixed or trapped charges and increased dielectric leakage.

In addition, the ability to purge $H_2O$ vapor may be inferior to the ability to purge $O_3$, resulting in a need to increase purge and/or evaporation times. Further, when $H_2O$ vapor is used as the oxidant, charge trapping may be induced at layer interfaces resulting in a deterioration or degradation of the interface characteristics. When these problems occur, the likelihood of soft errors in the resulting memory devices tends to be increased, compromising the reliability of the devices. However, when $O_3$ is used as the oxidant, the above-described problems are generally minimized or reduced and stable dielectric and leakage current characteristics may be obtained. In addition, the $O_3$ oxidant has a low dependency on an underlying layer and is, therefore, used in exemplary embodiments of the present invention.

Figure 3:
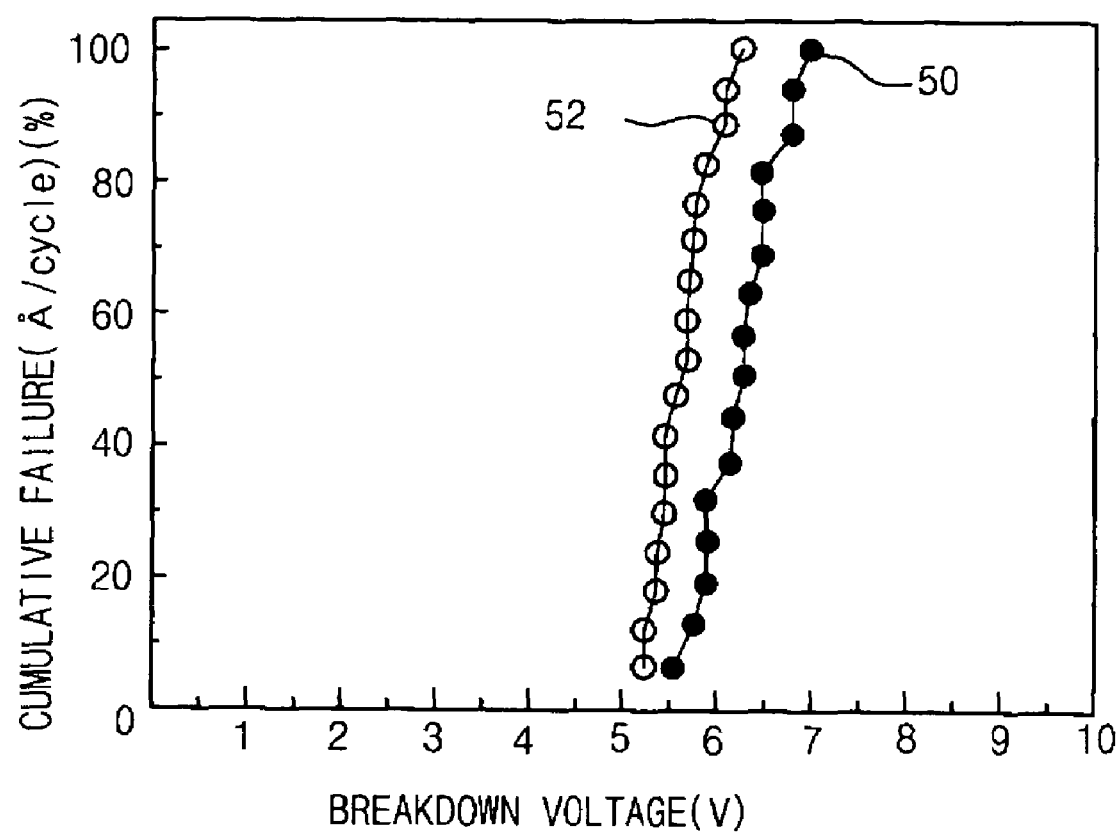
FIG. 3 illustrates cumulative failures obtained by measuring breakdown voltages at given positions of a substrate according to the kind of oxidants utilized during the formation of a $HfO_2$ layer according to exemplary embodiments of the present invention.

FIG. 3 is a graph illustrating cumulative failures obtained by measuring breakdown voltages at given positions on a substrate according to the kind of oxidants utilized during the formation of an $HfO_2$ layer according to exemplary embodiments of the present invention. In FIG. 3, the dielectric layer is a composite layer of $Al_2O_3$ (~about 30 Å) and $HfO_2$ (~about 10 Å). Trace 50 corresponds to the dielectric layer formed by using an $O_3$ oxidant and trace 52 corresponds to the dielectric layer formed using an $H_2O$ oxidant.

Referring to FIG. 3, it is noted that the $HfO_2$ layer formed using the $O_3$ oxidant has a higher breakdown voltage by about 0.5V than another exemplary $HfO_2$ layer formed using an $H_2O$ oxidant, and has a better stability as the dielectric layer.

Figure 4A:
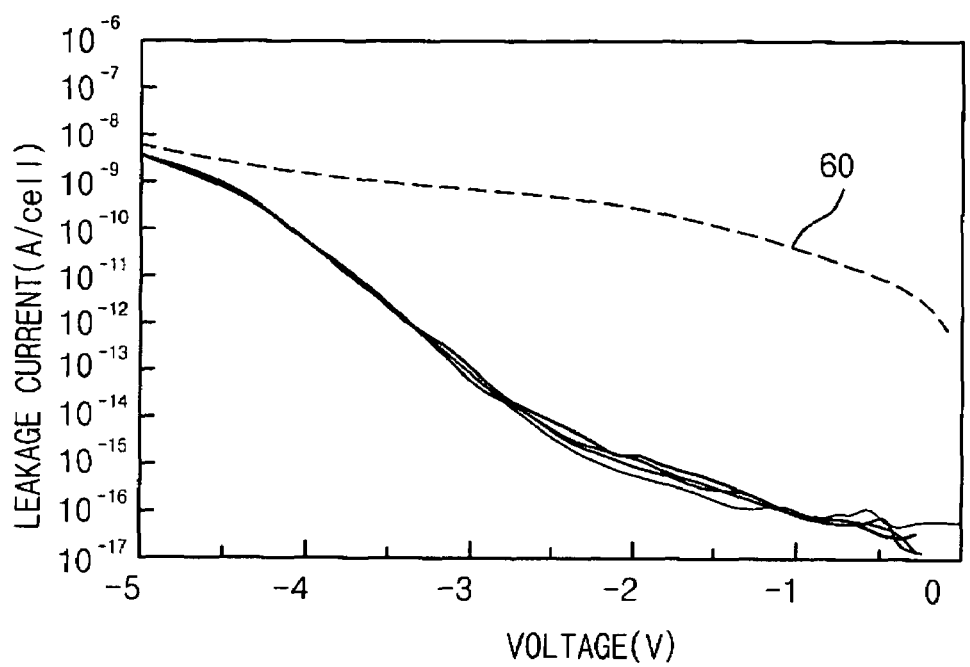
FIGS. 4A and 4B illustrate plots obtained by repeatedly measuring leakage currents with respect to voltages according to the kind of oxidants utilized during the formation of a $HfO_2$ layer according to exemplary embodiments of the present invention.
Figure 4B:
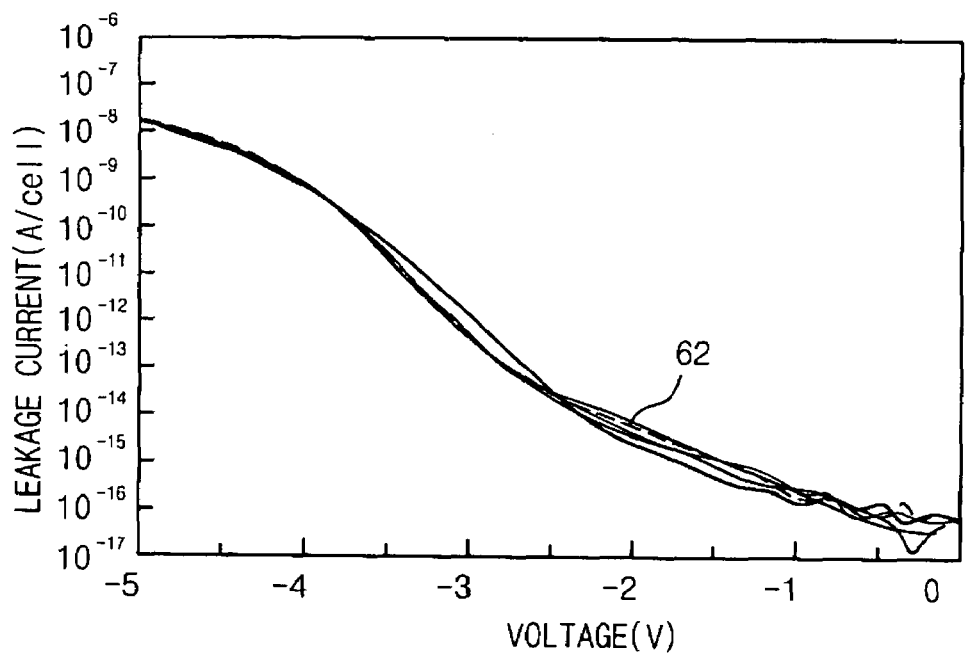

FIGS. 4A and 4B are graphs obtained by repeatedly measuring leakage currents with respect to voltages according to the kind of oxidants applied during forming a $HfO_2$ layer according to exemplary embodiments of the present invention. FIG. 4A corresponds to traces for a dielectric layer formed using a $H_2O$ oxidant and FIG. 4B corresponds to traces for a dielectric layer formed using an $O_3$ oxidant.

In FIGS. 4A and 4B, the dielectric layer was a composite layer of $Al_2O_3$ (30 Å) and $HfO_2$ (10 Å).

Referring to FIG. 4A, the traces were obtained by measuring leakage current five times while repeatedly sweeping the voltage from 0 to −5V. During the fourth voltage sweep, a deteriorated leakage current was detected (illustrated as trace 60) indicating that a breakdown was generated during the fifth repeated measurement.

Referring to FIG. 4B, the traces were obtained by measuring leakage current seven times while repeatedly sweeping the voltage from 0 to −5V. From this result, it may be confirmed that a stable leakage current is maintained as illustrated by trace 62 taken during the seven repeated sweepings that does not indicate any significant deterioration of the dielectric. Therefore, the dielectric layer formed using the $O_3$ oxidant illustrated a better performance under high voltage stress than a corresponding film formed using the $H_2O$ oxidant.

When the precursor containing the amino functional group is used to form a dielectric layer according to exemplary embodiments of the present invention, the deposition rate and dielectric properties of the resulting dielectric are improved over the conventional methods. Hereinafter, these properties will be described in more detail.

When the precursor containing the amino functional group is used for the formation of the $HfO_2$ layer according to exemplary embodiments of the present invention, the deposition rate of the layer is increased when compared with methods using the conventional halogen precursors. When a layer is formed using an ALD method, factors determining the deposition rate include the reactivity of the precursor and the three-dimensional size of the precursor. When the reactivity of the precursor with the oxidant is not high, the reaction rate slows and lowers the deposition rate. Similarly, when the three-dimensional size of the precursor is large, reaction sites where the precursor must be absorbed may be shielded by other precursors previously absorbed on adjacent reaction site, lowering the reactant density, slowing the reaction rate and lowering the deposition rate.

In order to evaluate reactivity, the reaction mechanism of the precursors of TEMAH and tBH (i.e., $Hf(OtBu)_4$) with an $O_3$ oxidant will be compared. For the case of TEMAH, the Hf—N bond of $Hf(NC_2H_5CH_3)_4$ is broken by the $O_3$ oxidant and a Hf—O bond is produced during the reaction. For the case of the tBu precursor, the Hf—O bond or Hf—O—C bonds are broken by the $O_3$ oxidant during the reaction. At this time, the bonding states of the reacting elements H and C is Hf—O and C—O before/after the reaction. Therefore, the driving force of the reaction is not as large. Accordingly, TEMAH is a more reactive precursor than tBH.

The molecular structures of tBH and TEMAH will be compared. The three-dimensional size of TEMAH [$Hf(NC_3H_8)_4$] is smaller that that of tBH [$Hf(OC_4H_9)_4$]. Therefore, the surface coverage of the Hf element is higher when using the TEMAH liquid source than when using the tBH source and will tend to increase the deposition rate.

Figure 5:
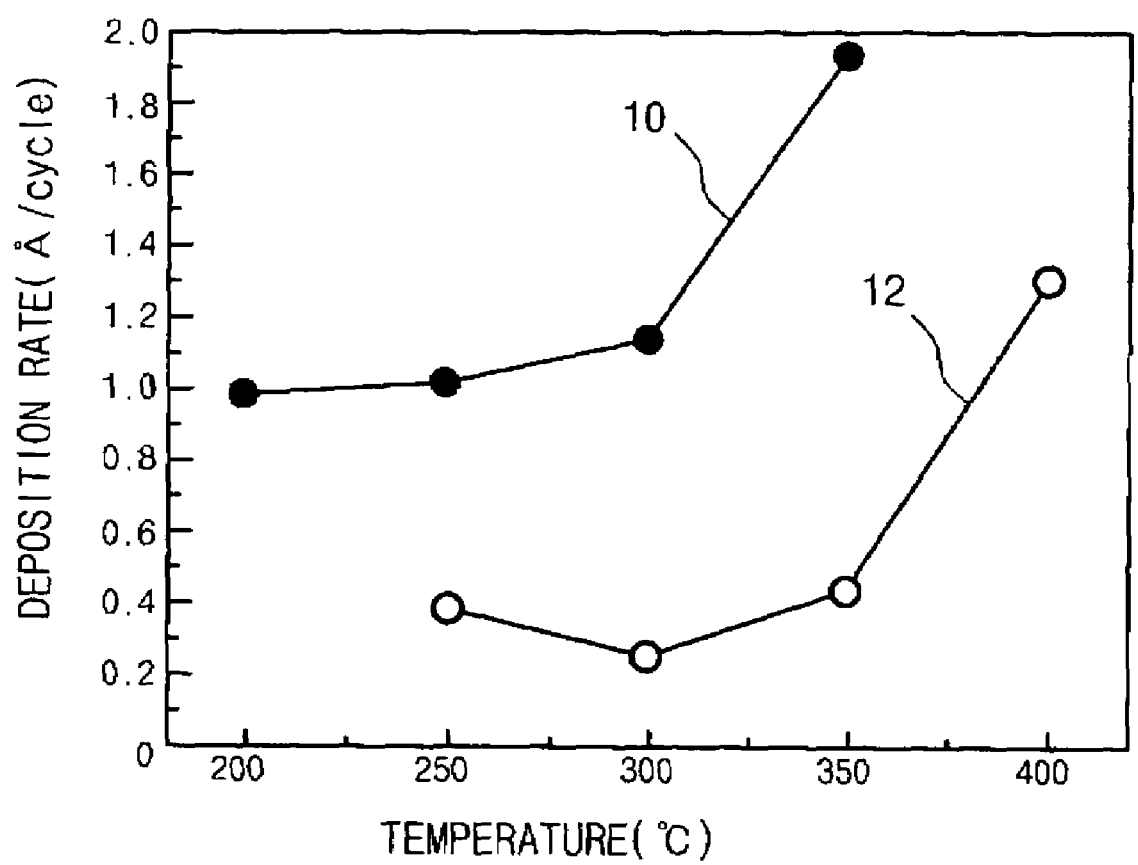
FIG. 5 illustrates deposition rates with respect to temperature for an ALD process according to exemplary embodiments of the present invention and according to a conventional method.

FIG. 5 illustrates graphs of deposition rates of $HfO_2$ layer with respect to temperatures during an ALD process according to exemplary embodiments of the present invention and according to a conventional method using a metal alkoxide compound as a precursor. In FIG. 5, trace 10 was obtained by forming the $HfO_2$ layer by an exemplary embodiment of the present invention and trace 12 was obtained through forming the $HfO_2$ layer by the conventional method.

In FIG. 5, the longitudinal axis represents the deposition temperature (° C.) and the vertical axis represents the thickness of the layer deposited per one cycle, that is, the deposition rate (Å/cycle).

In particular, the precursor in these exemplary embodiments, TEMAH, was introduced for about 2 seconds and a purging gas Ar was introduced for about 4 seconds. The oxidant, $O_3$, was then introduced for about 4 seconds and a purging gas Ar was introduced for about 4 seconds. This procedure was repeated at various temperatures and the deposition rate was measured for each temperature. The same procedure was then repeated using the precursor tBH (tetra-butoxy hafnium ($Hf(OtBu)_4$).

As reflected in trace 10 in FIG. 5, an ALD behavior is illustrated at the temperature range of 200-300° C. and the deposition rate within this range is almost constant during formation of the $HfO_2$ layer. However, a more chemical vapor deposition (CVD)-like behavior is observed at temperatures above 300° C. with the deposition rate increasing generally linearly with increasing temperature. At the reference temperature of 200° C., the deposition rate was about 1 Å/cycle.

When referring to trace 12 obtained while forming the $HfO_2$ layer by the conventional method, the ALD process behavior is observed across the temperature range of about 250-350° C. Further, the deposition rate at this temperature range is, at most, about 0.4 Å/cycle.

These results demonstrate that higher deposition rates for $HfO_2$ layers may be obtained by using metal precursors containing an amino functional group according to exemplary embodiments of the present invention when compared with metal precursors containing alkoxide functional groups. In addition, according to the present invention, the $HfO_2$ layer can be formed using an ALD process at a temperature of about 300° C. or less.

Even though an exemplary deposition temperature is 300° C. or less, an $HfO_2$ layer having a good electric characteristic can be formed at temperatures above 300° C. In particular, when $H_2O$ is used as an oxidant, a metal layer having a good electric characteristic can also be formed using an ALD process at about 350° C. Based on this experimental result, an exemplary temperature range for implementing the deposition may be about 100-500° C.

It has also been confirmed that a good step coverage (that is, a thickness ratio between the film formed on a structure at an upper portion and a bottom portion) of about 80% or over was obtained for a structure having an aspect ratio of about 13:1 or more when a layer is formed using an ALD method with TEMAH according to exemplary embodiments of the present invention.

Figure 6:
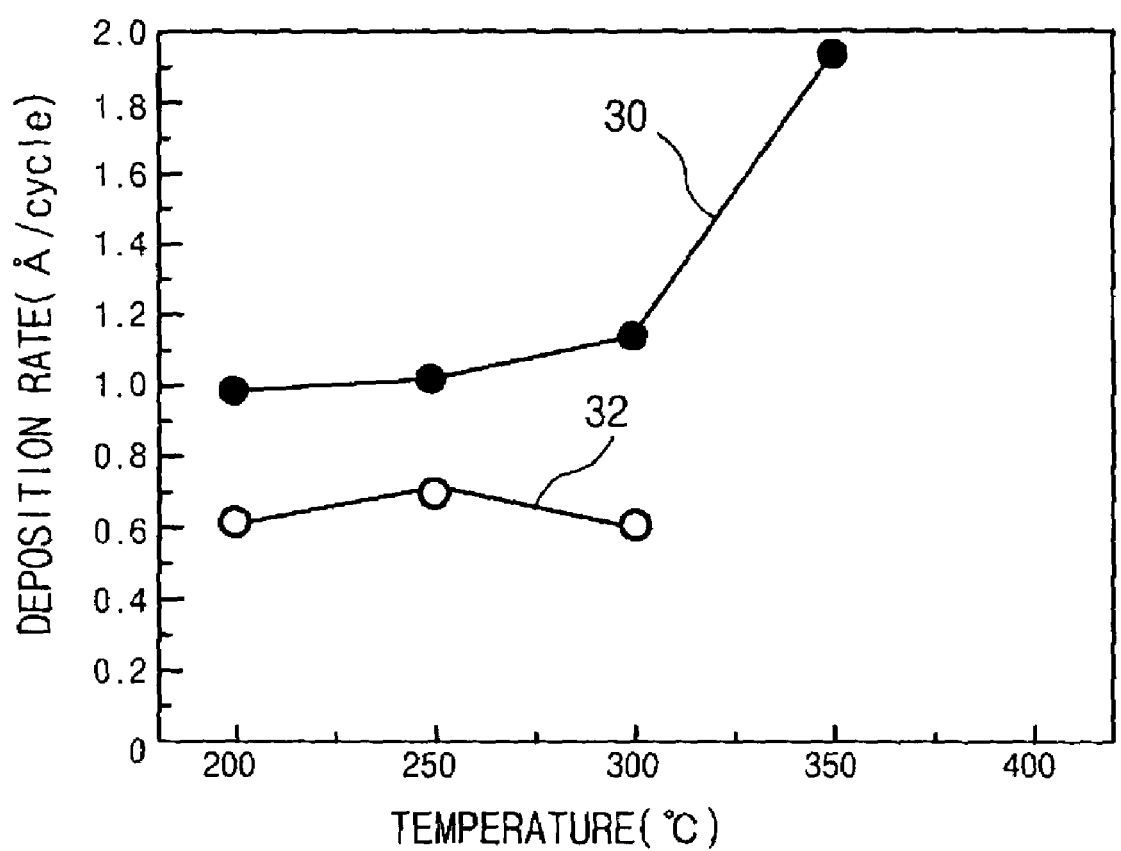
FIG. 6 illustrates deposition rates of a $HfO_2$ layer with respect to temperatures during implementation of ALD according to exemplary embodiments of the present invention on a planar plate and on a structure having a known aspect ratio.

FIG. 6 illustrates graphs of deposition rates of $HfO_2$ layer with respect to temperatures for implementing an ALD method according to exemplary embodiments of the present invention on a planar plate and on a structure having a known aspect ratio. Trace 30 was obtained when forming the $HfO_2$ layer on the planar plate and trace 32 was obtained when forming the $HfO_2$ layer on the structure having a known aspect ratio.

In FIG. 6, the longitudinal axis represents the deposition temperature (° C.) and the vertical axis represents the thickness of the layer deposited layer per cycle, that is, the deposition rate (Å/cycle).

In particular, the metal precursor TEMAH was introduced for about 2 seconds and a purging gas Ar was introduced for about 4 seconds. An $O_3$ oxidant was introduced for about 4 seconds and a purging gas Ar was introduced for about 4 seconds. This procedure was repeated at various temperatures for the two structures and the deposition rate was measured after completing the above-described steps once (one cycle).

Referring to FIG. 6, the deposition rate was almost constant in spite of the temperature variance. That is, an ALD processing behavior is observed for the planar plate and the structure having a higher aspect ratio across the temperature range. This means that a layer having a good thickness uniformity may be formed according to exemplary embodiments of the method of the present invention.

The deposition rate obtained at the temperature range of about 200-300° C. will be compared. The deposition rate was about 1 Å/cycle when forming the layer on the planar plate as illustrated in graph 30. On the contrary, the deposition rate was about 0.7 Å/cycle when forming the layer on the structure having a higher aspect ratio as illustrated by trace 32. This suggests that a pattern loading ratio or effect due to the shape of the pattern of an underlying layer may be about 30%. The pattern loading ratio is reflected in reduced ratio of deposition dependent on the shape of the substrate to which the film is being applied.

The deposition rate of the $HfO_2$ layer according to the temperature variance and the pattern loading ratio were compared for deposition processes implemented on a planar plate and on a structure having a high aspect ratio (greater that about 10:1) according to exemplary embodiments of the method of the present invention and the conventional method. The result is illustrated in Table 1 as follows.

TABLE 1

| Process condition | On planar silicon | High aspect ratio structure | Pattern loading ratio (%) |
|---|---|---|---|
| $Hf(OtBu)_4 + O_3$ 300° C. | y = 0.25x | y = 0.125x | 50 |
| TEMAH(100° C.) + $O_3$ 250° C. | y = 1.01x | y = 0.75x | 26 |
| TEMAH(100° C.) + $O_3$ 200° C. | y = 0.98x | y = 0.633x | 35 |

Referring to Table 1, tBH (tetra-butoxy hafnium, $Hf(OtBu)_4$) was used as the precursor and $O_3$ was used as the oxidant in the conventional method. When using tBH as the metal precursor, ALD properties were obtained up to a temperature of about 350° C., and therefore, the processing temperature was set to 300° C.

In the equation illustrated in Table 1, x represents a cycle number and y represents a thickness of a deposited layer. Each coefficient of x represents the measured deposition rate for each process under the indicated conditions. The deposition rate of the $HfO_2$ layer formed on a planar silicon plate according to exemplary embodiments of the present invention is about 4 times faster than that formed by the conventional method. Therefore, when forming the $HfO_2$ layer on the planar silicon plate, the processing time required for implementing exemplary embodiments of the present invention is reduced by about 75% when compared with the conventional method.

In addition, the deposition rate of the $HfO_2$ layer formed on the silicon structure having a high aspect ratio according to exemplary embodiments of the present invention was about six times faster than that formed by the conventional method. Therefore, when forming the $HfO_2$ layer on the silicon structure having the high aspect ratio, the processing time required for implementing exemplary embodiments of the present invention is only about one sixth that required for the conventional method.

When forming a thin film by using the precursor containing the amino functional group, the carbon content in the thin film is relatively small. Carbon contained in a dielectric layer increases a leakage current of a capacitor and adversely affects the stability of the dielectric layer. Accordingly, when the carbon content of the dielectric layer decreases, the electric properties of the resulting capacitor are improved. This characteristic will be described in more detail below.

Figure 7:
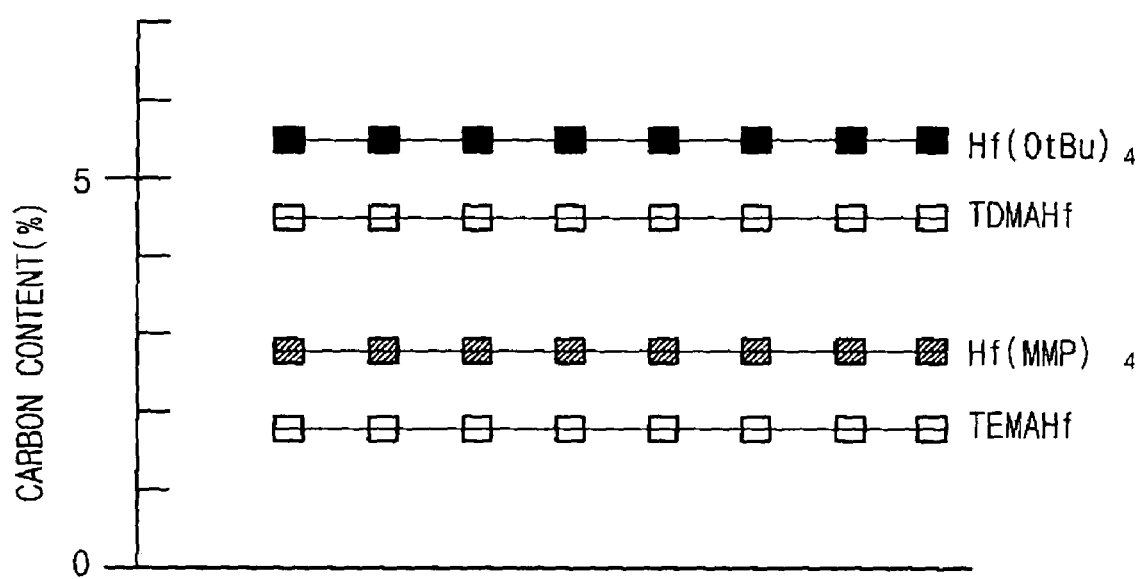
FIG. 7 illustrates carbon content of $HfO_2$ thin films formed using various precursor sources according to exemplary embodiments of the present invention when analyzed by a SIMS (second ion mass spectroscopy) analysis.

FIG. 7 illustrates the carbon content contained in a series of $HfO_2$ thin films formed through ALD processes using various precursor sources according to exemplary embodiments of the present invention and tested using a SIMS (second ion mass spectroscopy) analysis. In FIG. 7 the traces illustrate the carbon content of the various dielectric layers formed using different precursors.

Referring to FIG. 7, the carbon content in the dielectric layer is highest when the thin film is formed using a tBH [$Hf(OtBu)_4$] source. When inspecting the source having the molecular formula of $Hf(OBu)_4$, carbon is bonded to oxygen and the same O—C bonding is kept before/after carrying out a reaction with an oxidant. Accordingly, separation reaction of carbon from the bonding of Hf—O—C may be difficult and impede the removal of C—O bonds from a tBH source. On the contrary, the dielectric layer formed by deposition using the liquid source of TEMAH according to an exemplary embodiment of the present invention illustrates the lowest carbon content of the layers tested.

When the dielectric layer is formed by means of the deposition process of the precursor containing the amino functional group, nitrogen can be included in the dielectric layer without implementing any additional process. Recently, a thin film of $HfO_xN_y$ formed by adding nitrogen to an $HfO_2$ thin film is reported to have improved thin film properties.

For example, when $HfO_xN_y$ is used for the formation of a gate dielectric layer instead of $HfO_2$, the migration of boron ions and/or oxygen diffusion is suppressed and a thermal stability is good. Accordingly, the increase in the equivalent oxide thickness (EOT) for a layer due to a thermal budget is even smaller for gate dielectric layers formed using $HfO_xN_y$ when compared with gate dielectric layers formed using $HfO_2$.

In addition, it is reported that the thickness of an equivalent oxide layer ($E_{tox}$) of $HfO_xN_y$ is lower and a leakage current is better than $HfO_2$. Generally, the $HfO_xN_y$ layer is formed by depositing an HfN layer and then heat treating the layer in an oxidizing atmosphere to form an oxynitride layer.

However, when a precursor containing an amino functional group such as TEMAH is used to form the $HfO_2$ layer, nitrogen can be included in the resulting thin film without implementing a subsequent heat treatment. For example, it has been reported that an $HfO_2$ thin film formed using a low-pressure chemical vapor deposition (LPCVD) method using TEDAH [$Hf(N(C_2H_5)_2)_4$] and $O_2$, contains about 7% nitrogen.

According to repeated experiments conducted by the present inventors, it has been confirmed that an $HfO_2$ thin film formed using an ALD method using TEMAH and an $O_3$ oxidant also includes about 2% nitrogen. Therefore, a dielectric layer having good properties and including nitrogen therein can be advantageously formed according to exemplary embodiments of the method of the present invention.

Hereinafter, a method of manufacturing a semiconductor device will be described in order to explain a method of forming a capacitor according to an exemplary embodiment of the present invention.

FIGS. 8A-8E are cross-sectional views for explaining a method of forming a capacitor in a semiconductor process according to an exemplary embodiment of the present invention.

Figure 8A:
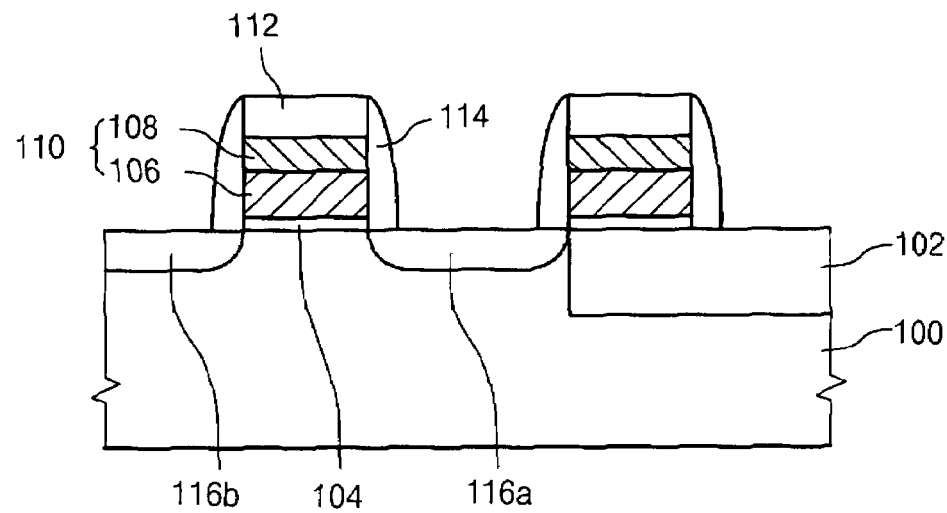
FIGS. 8A-8E are cross-sectional views for explaining a method of forming a capacitor in a semiconductor process according to an exemplary embodiment of the present invention.

Referring to FIG. 8A, an active region and a field region 102 are separately formed on a semiconductor substrate 100 by performing an isolation process. Thereafter, a transistor including a gate insulation layer 104, a gate electrode 110 and a source/drain region 116a and 116b, is formed on the substrate 100. A thin gate insulation layer 104 having a thickness of about 20 Å or less is required for the manufacture of a semiconductor device having a memory having a capacity of about 1 gigabit or more. However, the decrease in the gate insulation layer 104 may cause problems such as increased gate leakage current, penetration of dopant impurities in the gate, decreased threshold voltage, and the like. Therefore, the gate insulation layer 104 is preferably formed using a material having a high insulating property and a high dielectric constant by means of an ALD process according to exemplary embodiments of the present invention.

That is, the gate insulation layer 104 including $HfO_2$ is formed by using a liquid source containing hafnium and an amino functional group and an oxidant using an ALD process as illustrated in FIGS. 2A-2E. The liquid source containing hafnium and the amino functional group may include precursors such as TEMAH, TDEAH and TDMAH.

The oxidant may be an activated oxidant such as ozone ($O_3$) produced by a plasma generator, plasma $O_2$, remote plasma $O_2$, and plasma $N_2O$ or a compound containing a hydroxyl functional group such as $H_2O$ or $H_2O_2$. The gate electrode 110 may be formed with a polycide structure including an impurity doped polysilicon layer 106 and a metal silicide layer 108. The gate electrode 110 may also be formed with a structure that includes an impurity doped polysilicon layer 106 and a metal layer including a metal such as tungsten (W). At the upper portion and side portion of the gate electrode 110, a capping insulation layer 112 including silicon oxide and a side wall spacer 114 including silicon nitride are formed, respectively.

Figure 8B:
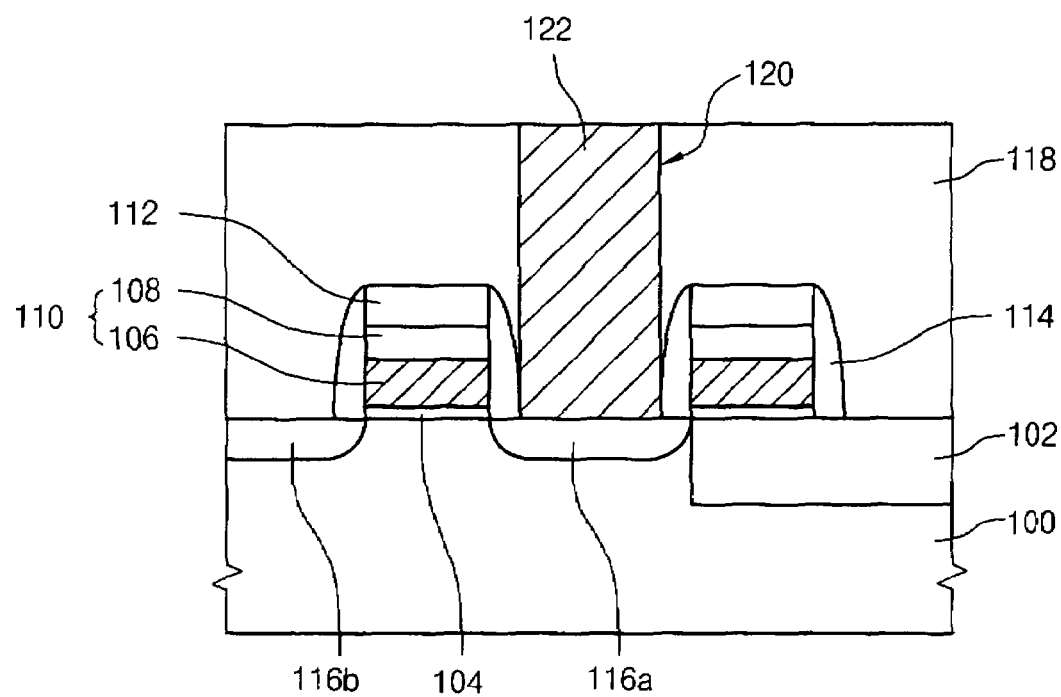

Referring to FIG. 8B, a first insulation layer 118, typically an oxide, is formed on the whole surface of the substrate 100 on which the transistor is formed. A contact hole 120 for exposing a portion of the source region 116a is formed by etching the first insulation layer 118 using a photolithography process. After that, a contact plug 122 is formed in the contact hole 120 by depositing a phosphorous (P) doped polysilicon layer to form a first conductive layer that fills up the contact hole 120 and is formed on the first insulation layer 118. The upper portion of the first conductive layer is then removed with an etch back process or a chemical mechanical polishing (CMP) to leave the conductive plug 122.

Figure 8C:
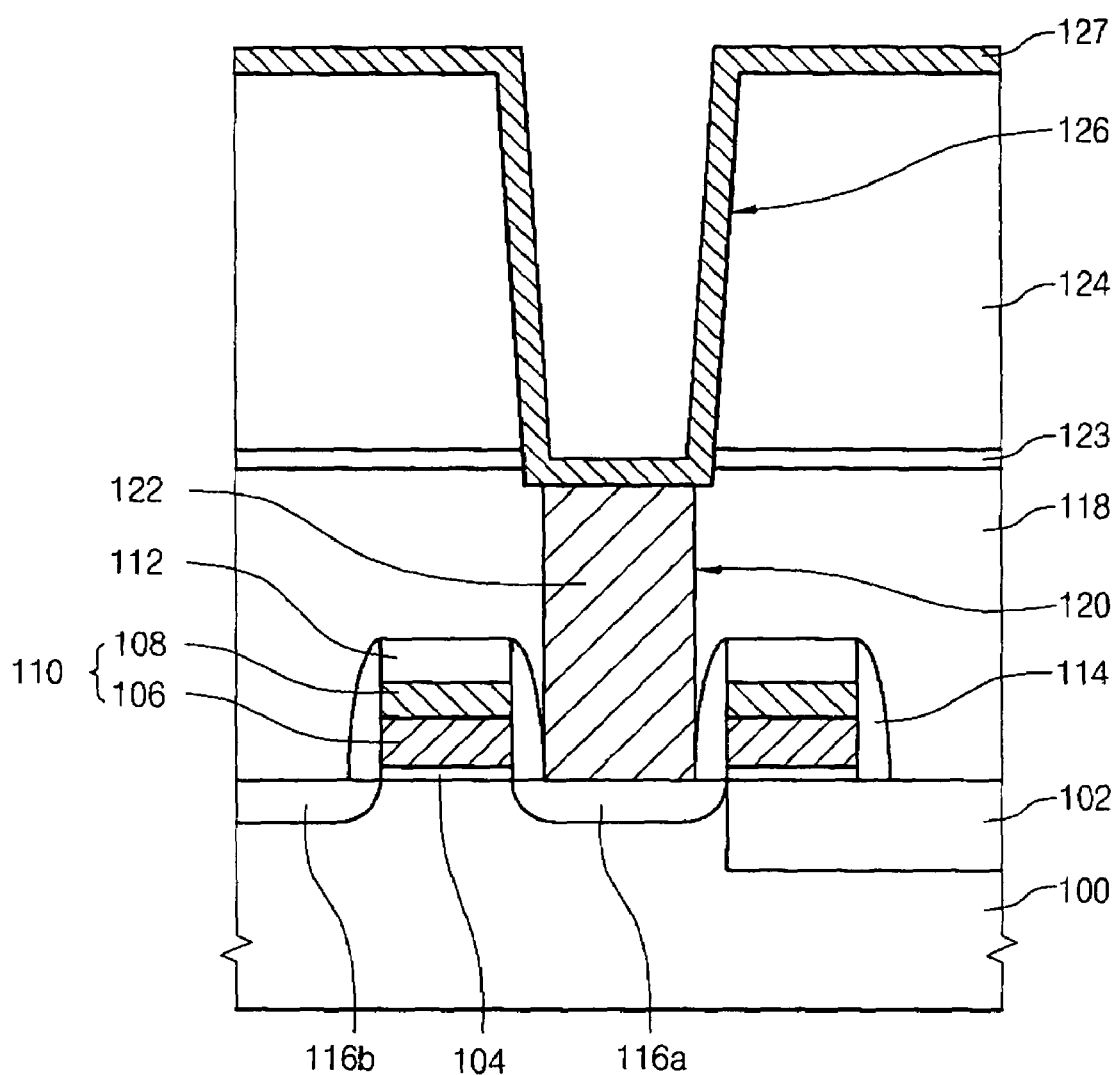

Referring to FIG. 8C, an etch stop layer 123 is formed on the contact plug 122 and the first insulation layer 118. The etch stop layer 123 is selected to provide a high etching selectivity with respect to the first insulation layer 118 such as a silicon nitride ($Si_xN_y$) layer or a silicon oxynitride (SiON) layer.

A second insulation layer 124, typically an oxide, is formed on the etch stop layer 123 and then etched to form an opening 126 to expose the contact plug 122. In particular, the second insulation layer 124 is etched until the etch stop layer 123 is exposed. After that, the etch stop layer 123 is etched to form the opening 126 and expose the contact plug 122 and an adjacent portion of the first insulation layer 118. The opening 126 may be formed with a vertical inclination resulting in the bottom portion of the opening 126 being narrower than the upper open portion thereof. This shape may be obtained in part due to a loading effect during the etch process in which the etch rate at the bottom portion is slower than that at the upper portion of the opening 126.

A second conductive layer 127 is formed on the side portion and bottom portion of the opening 126 and on the second insulation layer 124. The second conductive layer 127 may be formed from a semiconductor material such as doped polysilicon, a metal such as ruthenium (Ru), platinum (Pt) and iridium (Ir), a conductive metal nitride compound such as TiN, TaN and WN, or a composite structure of two or more of these materials.

Figure 8D:
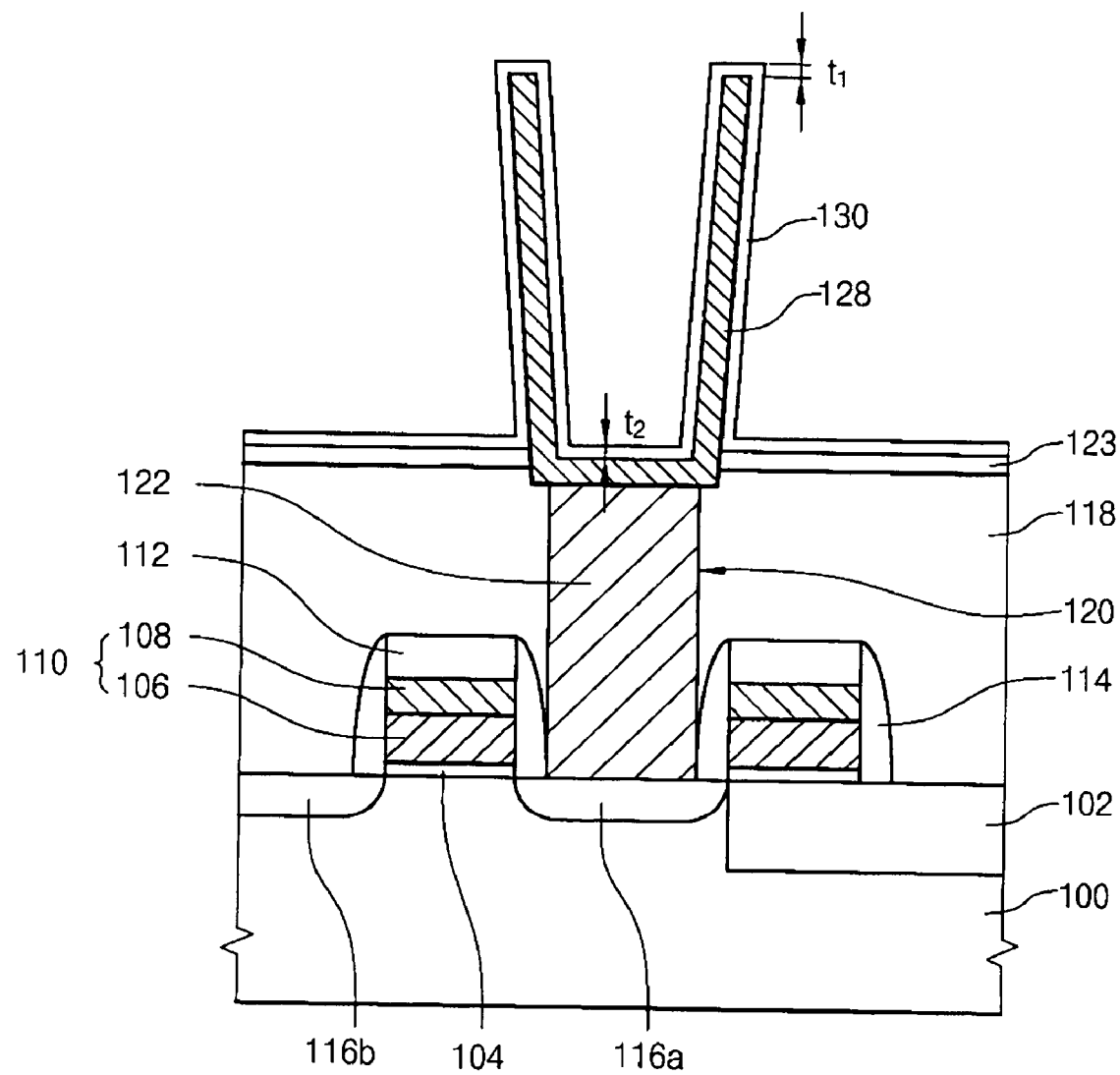

Referring to FIG. 8D, a sacrificial layer (not shown) is formed on the second conductive layer 127 and the opening 126. The upper portion of the sacrificial layer is then etched back so that the second conductive layer 127 may remain on the side portion and bottom portion of the opening 126. The second conductive layer 127 deposited on the surface portion of the second insulation layer 124 is removed. The second conductive layer 127 deposited along the profile of the inner portion of the opening portion 126 is then separated with the cell unit to form a lower electrode 128 of a capacitor at each cell region. After that, the sacrificial layer may be removed using a wet etch process. The lower electrode 128 may be formed to have a generally cylindrical shape in which the inlet portion is wide and bottom portion is narrow having a height of about 10,000-17,000 Å.

On the lower electrode 128, a dielectric layer 130 including $HfO_2$ is formed using a liquid source containing hafnium and an amino functional group and an oxidant, and an ALD method for example as illustrated in FIGS. 2A-2E. More particularly, the dielectric layer 130 of the capacitor may be formed by depositing $HfO_2$ by reacting TEMAH and $O_3$ using an ALD process. When forming the $HfO_2$ layer using TEMAH and $O_3$ with an ALD process, a dielectric layer 130 having a good step coverage can be achieved on the lower electrode 128 having an aspect ratio of about 13:1 or more. The ratio of the upper thickness ($t_1$) and the lower thickness ($t_2$) of thus formed dielectric layer 130 is about 1:0.8.

The dielectric constant of $HfO_2$ may be as high as about 20-25. A capacitor including a dielectric layer formed using $HfO_2$ will have a relatively high storage capacity when comparing with a capacitor using a dielectric layer formed using a similar thickness of a material having a relatively low dielectric constant. In addition, since the capacitor including $HfO_2$ has a relatively high energy band gap, a stable leakage current characteristic may be more easily obtained.

The dielectric layer 130 may be formed as a single layer of $HfO_2$ or may be formed as a composite layer including two or more layers of metal oxides that are alternately deposited. For example, the dielectric layer 130 may be formed by alternately depositing the layers of $Al_2O_3$ and $HfO_2$ by changing the precursors introduced into the chamber during the ALD process.

In particular, an $Al_2O_3$ layer having a thickness of about 35 Å may be formed using a TMA precursor and an $O_3$ oxidant. After that, an $HfO_2$ layer having a thickness of about 35 Å may be formed on the $Al_2O_3$ layer using a TEMAH precursor instead of the TMA precursor and applying the same ALD process conditions to form a dielectric layer 130 having an alternately deposited structure of the $Al_2O_3/HfO_2$. A dielectric layer having an alternate structure of $Al_2O_3/HfO_2/Al_2O_3/HfO_2$ or $HfO_2/Al_2O_3$ also can be formed instead of the $Al_2O_3/HfO_2$ layer by modifying the deposition sequence.

When the lower electrode 128 is formed of polysilicon, silicon contained in the lower electrode 128 and oxygen will tend to react during heat treatments and oxidize the lower electrode 128. Therefore, before forming the dielectric layer 130, the surface portion of the lower electrode 128 may be nitrified by a rapid thermal process (RTP) under an atmosphere containing nitrogen to reduce or prevent a reaction between the dielectric layer 130 and the lower electrode. A SiN or SiON layer formed by the nitrification reaction at the surface portion of the lower electrode 128 functions as a portion of the dielectric layer of the capacitor along with the $HfO_2$ layer. Accordingly, the dielectric layer may be formed including an alternate structure of nitride layer/$Al_2O_3$/$HfO_2$ or nitride layer/$HfO_2$.

Figure 8E:
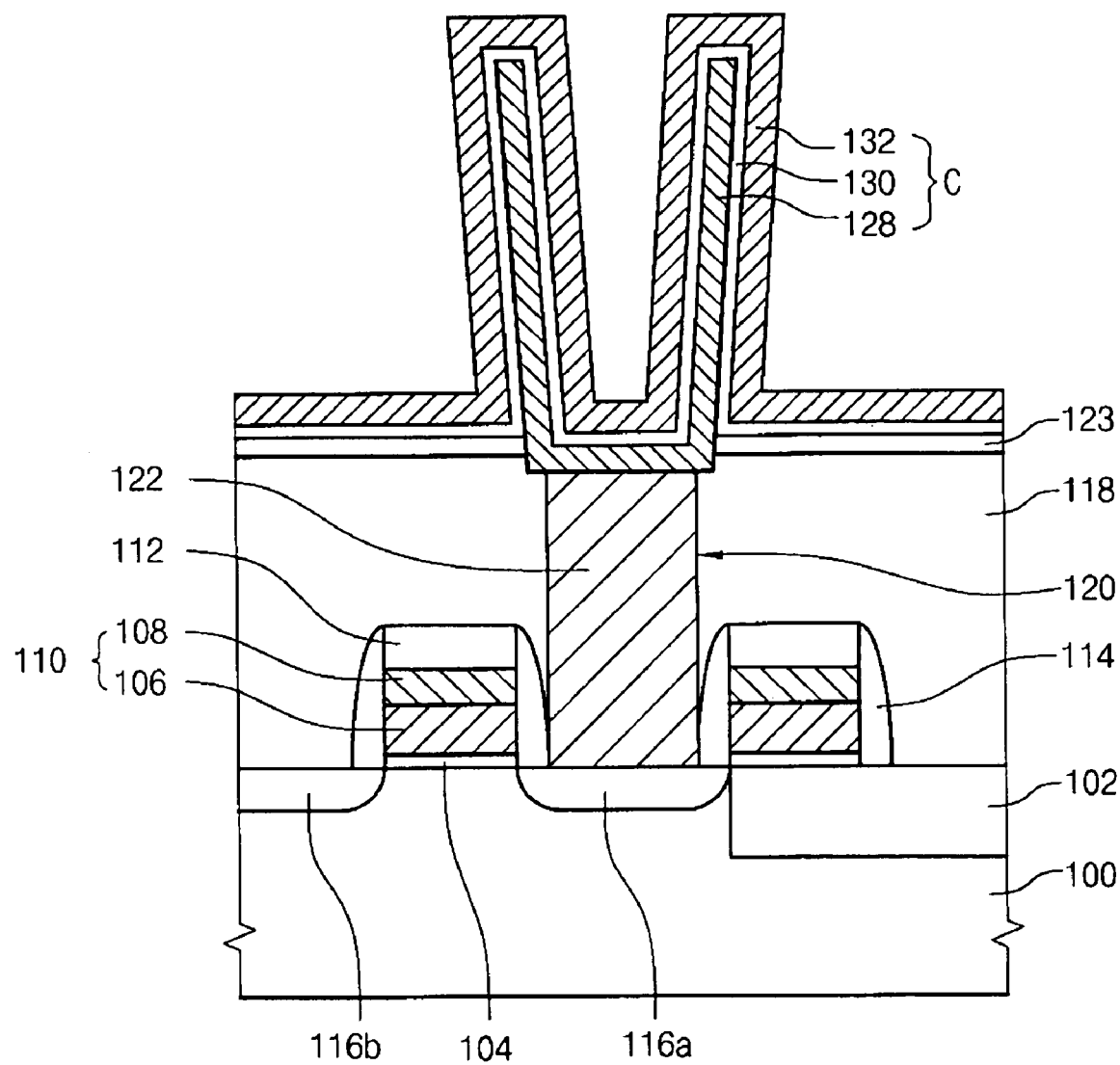

Referring to FIG. 8E, after being formed, the dielectric layer may be heat treated to remove contaminants formed on or incorporated in the dielectric layer and to cure oxygen defects. The heat treatment may be implemented under an atmosphere of ultraviolet-$O_3$ (UV-$O_3$), plasma $O_2$, remote plasma $O_2$, nitrogen gas or vacuum.

An upper electrode 132 is formed on the dielectric layer 130 to form a capacitor C including the lower electrode 128, the dielectric layer 130 and the upper electrode 132. The upper electrode 132 may be formed using a semiconductor material including polysilicon, a metal such as ruthenium (Ru), platinum (Pt) or iridium (Ir), a conductive metal nitride such as TiN, TaN or WN, or a composite of two or more such materials. In an exemplary embodiment, the upper electrode 132 has a stacked structure with layers of both TiN and polysilicon.

Figure 9:
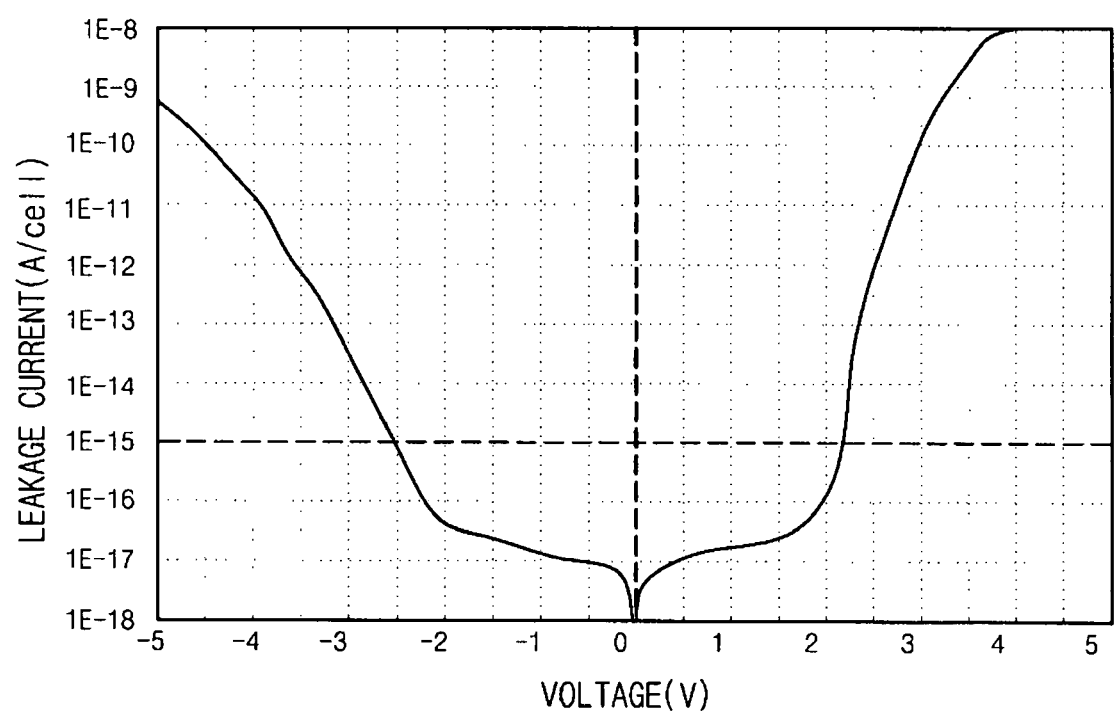
FIG. 9 illustrates leakage current with respect to voltage of a capacitor having a dielectric layer formed by an ALD method according to an exemplary embodiment of the present invention.

FIG. 9 is a graph illustrating a leakage current with respect to a voltage of a capacitor having a dielectric layer formed by an ALD method according to an exemplary embodiment of the present invention. In this graph, the longitudinal axis represents a voltage (V) and the vertical axis represents a leakage current (A/cell).

The capacitor may be formed, for example, by the above-described method as illustrated in FIGS. 8A-8E. More particularly, a nitrification process may be carried out by means of an RTP process using $N_2$ or $NH_3$ gas on the surface portion of the lower electrode of phosphorus (P) doped polysilicon. On the lower electrode, an $Al_2O_3$ layer having a thickness of about 35 Å was formed and an $HfO_2$ layer having a thickness of about 10 Å was formed on the $Al_2O_3$ layer to form a composite dielectric layer. The $HfO_2$ layer was formed using TEMAH and $O_3$ at a temperature range of about 100-300° C., using an ALD process. After forming the $HfO_2$ layer, a heat treatment at 750° C., under vacuum was implemented for about 2 seconds. An equivalent oxide thickness (EOT) of thus formed dielectric layer was about 20-30 Å.

The EOT represents a thickness of silicon oxide layer having the same capacitance with that of a capacitor including a dielectric layer formed by depositing materials other than silicon dioxide. Therefore, when two capacitors having different dielectric layers have the same capacitance, a dielectric layer having a lower EOT has a higher dielectric constant. The capacitance is inversely proportional to the thickness of the oxide layer and is proportional to the dielectric constant.

Therefore, a dielectric layer having a low EOT has a high dielectric constant. In FIG. 9, the dielectric layer had an EOT of about 29.7 Å. After completing the above-described processes, a TiN layer was formed through a deposition process using $TiCl_4$ and $NH_3$ gas on the $HfO_2$ layer. A phosphorous-doped polysilicon layer was then formed as the upper electrode having a TiN/polysilicon structure.

As can be noted from FIG. 9, the capacitor manufactured by an exemplary embodiment of the present invention illustrates a leakage current of about 1 fA/cell or lower at a voltage of about 1V. The capacitor formed by the exemplary embodiment of the method of the present invention illustrates a stable leakage current characteristic even though being formed on a structure having an aspect ratio of about 13:1 or more.

Figure 10:
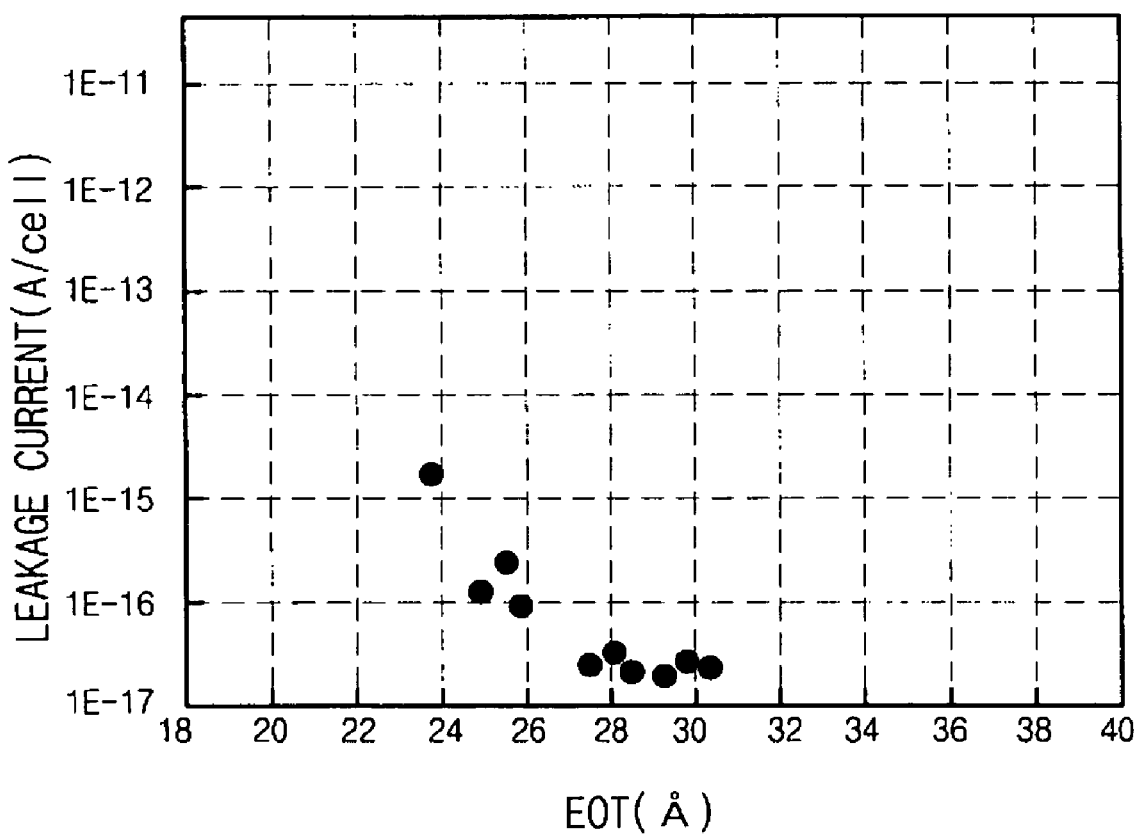
FIG. 10 illustrates leakage current with respect to the EOT (equivalent oxide thickness) of a capacitor having a dielectric layer formed using an ALD method according to an exemplary embodiment of the present invention.

FIG. 10 is a graph illustrating a leakage current with respect to an EOT of a capacitor having a dielectric layer formed by an ALD method according to exemplary embodiments of the present invention. In FIG. 10, the longitudinal axis represents an equivalent oxide thickness (Å) of the dielectric layer and the vertical axis represents a leakage current (A/cell). The dielectric layer of the capacitor is formed as a complex layer of $Al_2O_3/HfO_2$ and the leakage current was measured with a voltage of 1.2V applied to the capacitor.

Referring to FIG. 10, the measured leakage current was 1 fA/cell or less when the EOT of the dielectric layer of the capacitor was about 24-30 Å. Accordingly, the capacitors formed using the above-described exemplary processes illustrate a stable leakage current.

FIGS. 11A to 11J are cross sectional views illustrating a method of forming a thin film structure in accordance with an example embodiment of the present invention.

Figure 11A:
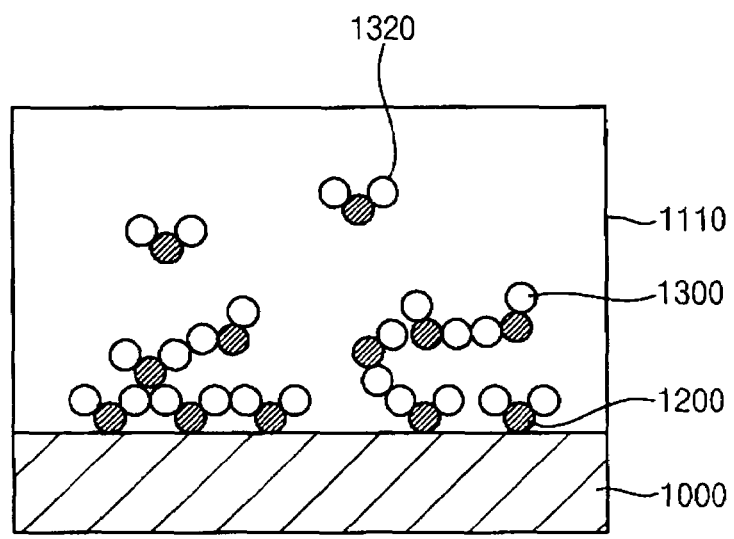
FIGS. 11A to 11J are cross sectional views illustrating a method of forming a thin film structure in accordance with an example embodiment of the present invention.

Referring to FIG. 11A, a substrate 1000, such as a silicon wafer, may be placed in a chamber 1110. Although discussed herein as a silicon wafer, the substrate 1000 may be any suitable material.

When the chamber 1110 has a temperature of below approximately 200° C., a first reactant may be introduced into the chamber 1110 and may not suitably reactive. When the chamber 1110 has a temperature of above approximately 400° C., ingredients in a thin film formed on the substrate 1000 may be crystallized. A thin film structure 4000 (see FIG. 11J) may be formed on the substrate 1000, for example, using an atomic layer deposition (ALD) process when the chamber 1110 has a temperature of below approximately 400° C. to suppress (e.g., prevent) the thin film structure 4000 from forming during, for example, a chemical vapor deposition (CVD) process. Although atomic layer deposition (ALD) and chemical vapor deposition (CVD) processes are discussed herein, it will be understood that any suitable process may be used in connection with example embodiments of the present invention. The chamber 1110 may have a temperature of approximately 200° C. to approximately 400° C., inclusive, to form the thin film which may have improved characteristics (i.e., suitable characteristics). The chamber 1110 may have a temperature of approximately 300° C., and the thin film structure 4000 may be formed, for example, on the substrate 1000 using an ALD process.

The chamber 1110 may have a pressure of below approximately 0.1 Torr, and the reactant introduced into the chamber 1110 may not be suitably reactive. A pressure within the chamber 1110 of above about 3.0 Torr may not be suitable for controlling processing conditions. The chamber 1110 may have a pressure of approximately 0.1 Torr to approximately 3.0 Torr, inclusive, to form (e.g., precisely form) the thin film structure 4000 having improved characteristics (e.g., suitable characteristics) according to an example embodiment of the present invention.

The pressure and the temperature of the chamber 1110 may be controlled, and a first reactant may be provided onto the substrate 1000 disposed in the chamber 1110. The first reactant may have a gas phase through the use of, for example, a bubbler. Although a bubbler is discussed herein, it will be understood that any suitable apparatus for providing a first reactant in a gas phase may be used. The first reactant may be a zirconium precursor such as, for example, tetrakis-methyl ethyl amino zirconium (TEMAZ; $Zr[N(CH_3)(C_2H_5)]_4$) or zirconium butyl oxide ($Zr(O-tBu)_4$). The zirconium precursor may include a mixture of, for example, TEMAZ and/or zirconium butyl oxide. Although tetrakis-methyl ethyl amino zirconium (TEMAZ; $Zr[N(CH_3)(C_2H_5)]_4$), zirconium butyl oxide ($Zr(O-tBu)_4$) or a combination thereof are described herein, it will be understood that any suitable precursor may be used. The first reactant may be provided onto the substrate 1000 for approximately 0.5 seconds to approximately 3 seconds, inclusive.

When the first reactant is provided onto the substrate 1000, a first portion 1200 of the first reactant may be chemisorbed on the substrate 1000. A second portion 1300 of the first reactant may be physically absorbed to the chemisorbed first portion 1200 and/or that the second portion 1300 of the first reactant may drift in the chamber 1110.

Figure 11B:
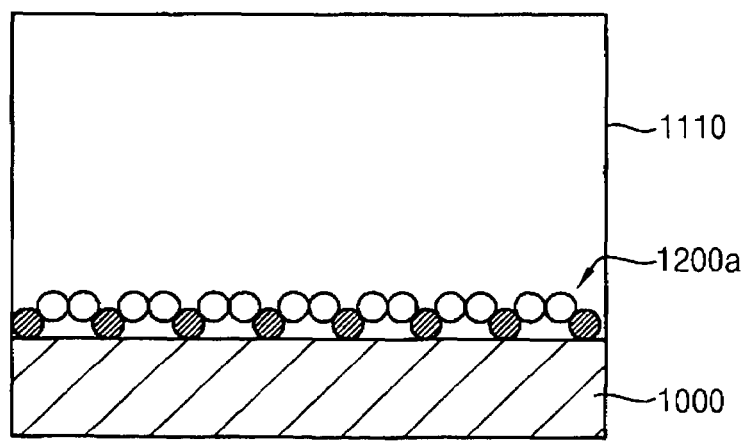

Referring to FIG. 11B, a first gas (e.g., a first purge gas) may be introduced into the chamber, for example, after providing the first reactant onto the substrate 1000. The first gas may include an inert (or inactive) gas such as, for example, an argon (Ar) gas and/or a nitrogen ($N_2$) gas. The first gas may be provided into the chamber 1110 for approximately 0.5 seconds to approximately 20 seconds, inclusive.

When the first gas is provided into the chamber 1110, the second portion 1300 of the first reactant may be removed from the chamber 1110. The drifting second portion 1320 and the physically absorbed second portion 1300 may be removed from the substrate 1000 and the chamber 1110. The chemisorbed first portion 1200 of the first reactant may remain on the substrate 1000.

In an example embodiment of the present invention, the drifting second portion 1320 and the physically absorbed second portion 1300 may be removed from the substrate 1000 and the chamber 1110 by vacuumizing the chamber 1110 for approximately 2 seconds to approximately 10 seconds, inclusive.

In another example embodiment of the present invention, the drifting second portion 1320 and the physically absorbed second portion 1300 may be removed from the substrate 1000 and the chamber 1110 by introducing the first gas into the chamber 1110 and vacuumizing the chamber 1110, for example, simultaneously.

Figure 11C:
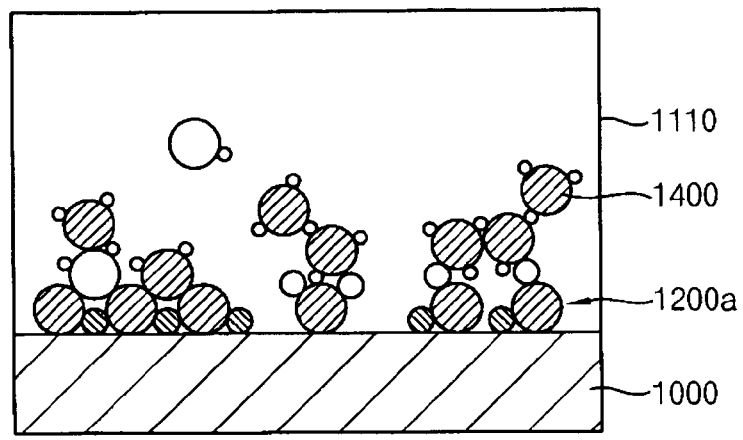

Referring to FIG. 11C, an oxidant 1400 may be introduced into the chamber 1110, for example, after removing the drifting second portion 1320 and the physically absorbed second portion 1300. The oxidant 1400 may include, for example, an ozone ($O_3$) gas, an oxygen ($O_2$) gas, a water ($H_2O$) vapor, an oxygen plasma, a remote oxygen plasma, etc. These gases or plasmas may be used independently. Alternatively, a mixture of these gases and/or plasmas may be used as the oxidant 1400. Although an ozone ($O_3$) gas, an oxygen ($O_2$) gas, a water ($H_2O$) vapor, an oxygen plasma, a remote oxygen plasma, it will be understood that any suitable gas or combination of gases may be used in connection with example embodiments of the present invention. The first oxidant 1400, which may include the ozone gas ($O_3$) may be provided into the chamber 1110 for approximately 1 second to approximately 7 seconds, inclusive.

When the oxidant 1400 is provided on the substrate 1000, a chemisorbed zirconium precursor 1200a in the first portion 1200 of the first reactant may be chemically reacted with the oxidant 1400, and the chemisorbed zirconium precursor 1200a may be oxidized.

Figure 11D:
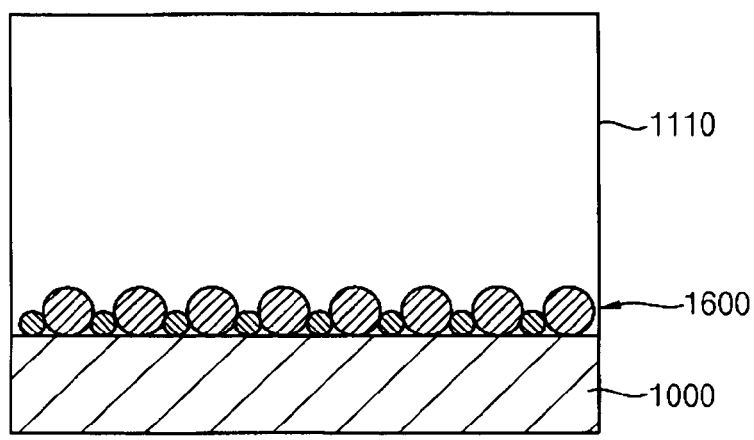

Referring to FIG. 11D, a second gas (e.g., a second purge gas) may be introduced into the chamber 1110, for example, after oxidizing the chemisorbed zirconium precursor 1200a. The second gas may be the same, or substantially the same, as the first purge gas. The second gas may be provided into the chamber 1110 for the same, or substantially the same, time to that of the first gas.

When the second gas is provided into the chamber 1110, a remaining portion of the oxidant 1400 that may not have reacted with the chemisorbed zirconium precursor 1200a may be removed from the chamber 1110. A solid-phased material (e.g., a metal oxide material) 1600, which may include zirconium oxide ($ZrO_2$), may be formed on the substrate 1000.

Figure 11E:
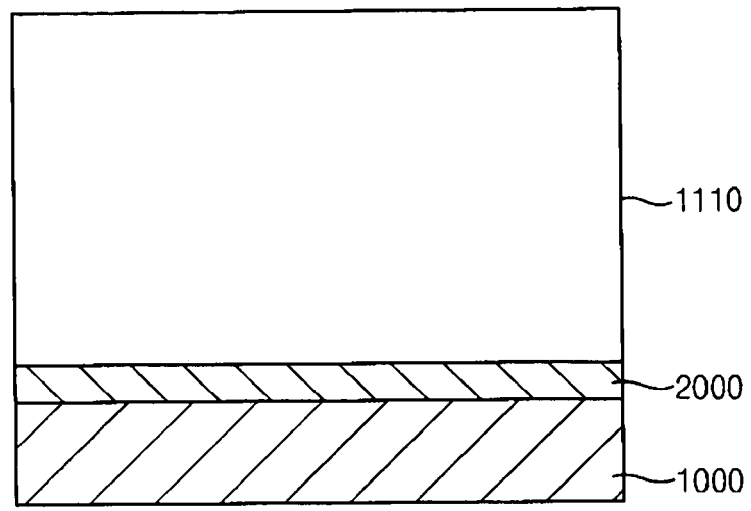
Figure 11F:
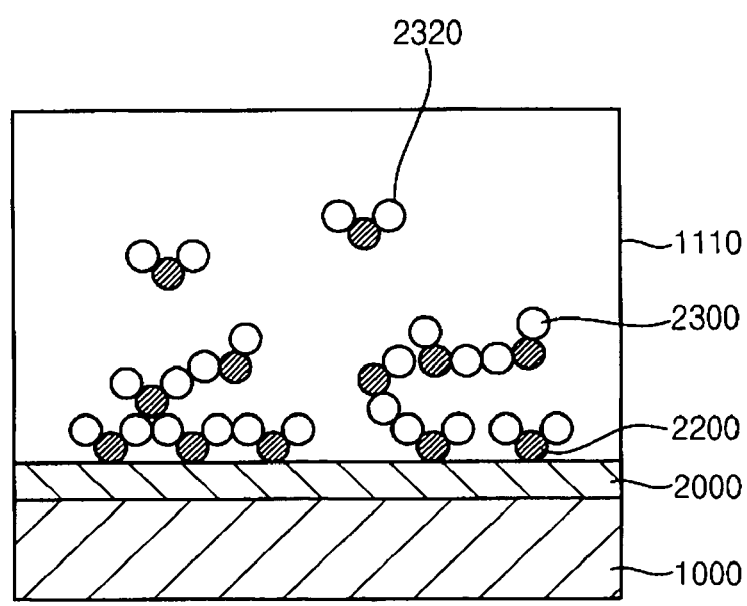

Referring to FIG. 11E, the process described with reference to FIGS. 11A to 11D may be repeated at least once. A first thin film 2000, which may include the first solid-phase material (e.g., a metal oxide material) 1600 of zirconium oxide may be formed on the substrate 1000, that is, a zirconium oxide film may be formed on the substrate 1000 as the first thin film 2000.

Figure 12:
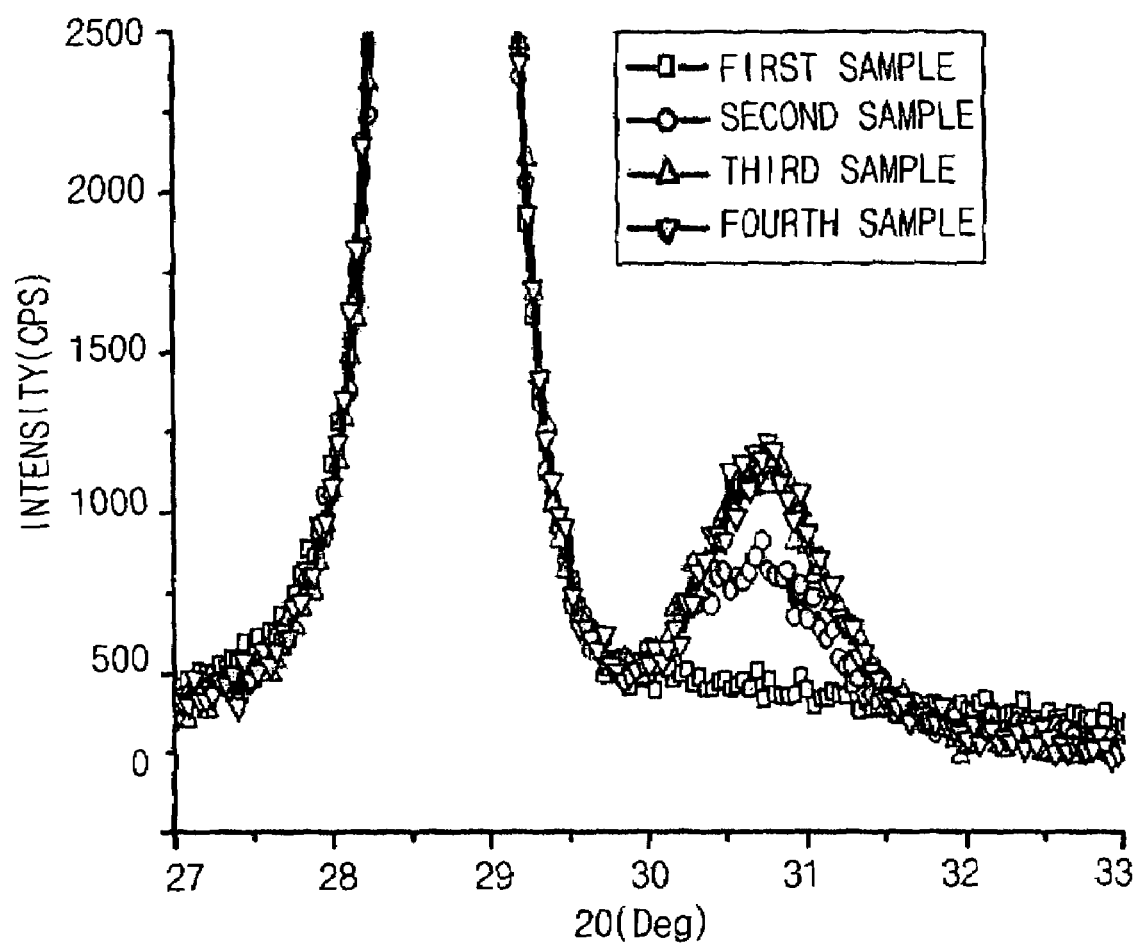
FIG. 12 is a graph illustrating crystalline structures of thin films formed in accordance with example embodiment of the present invention.

FIG. 12 is a graph illustrating example crystalline structures of thin films relative to thermal treatment temperature in accordance with an exemplary embodiment of the present invention.

In FIG. 12, a silicon oxide film, a polysilicon film and a titanium nitride film may be formed (e.g., sequentially formed) on a bare silicon wafer, and a zirconium oxide film, which may correspond to the first thin film may be formed on the titanium nitride film by, for example, an example embodiment of the present invention as described with reference to FIGS. 11A to 11E. The silicon oxide film may have a thickness of approximately 1,000 Å, the polysilicon film may have a thickness of approximately 5,000 Å, and the titanium nitride film may have a thickness of approximately 300 Å. The zirconium oxide film may have a thickness of approximately 100 Å. A first sample, which may include the zirconium oxide film, may be prepared. A second sample, which may include the zirconium oxide film, may be prepared by, for example, by thermally treating the first sample at a temperature of approximately 400° C. for approximately 5 minutes, and a third sample, which may include the zirconium oxide film, may be prepared by thermally treating the first sample at a temperature of approximately 500° C. for approximately 5 minutes. Additionally, a fourth sample, which may include the zirconium oxide film, may be prepared by thermally treating the first sample at a temperature of approximately 600° C. for approximately 5 minutes.

Referring to FIG. 12, crystalline structures of the first to fourth samples may be observed using, for example, an X-ray diffractometer. The first sample may include the zirconium oxide film, which may not have any crystalline structure. The second to the fourth samples may include the zirconium oxide films, which may have respective crystalline structures. The zirconium oxide film may be crystallized at a temperature of, for example, greater than approximately 400° C. The zirconium oxide film may have a higher dielectric constant of approximately 35 and a thin equivalent oxide thickness (EOT), however, the zirconium oxide film alone may not be used for a dielectric layer of a capacitor, due to the crystallization of the zirconium oxide film at a lower temperature. In example embodiments of the present invention, a second thin film may be formed on the first thin film 2000 to suppress (e.g., prevent) crystallization of the first thin film 2000.

Referring to FIG. 11E, a second reactant may be provided on the first thin film 2000 formed on the substrate 1000. The chamber 1110 may have the same, or substantially the same, temperature and/or a pressure as described with reference to FIG. 11A.

The second reactant may include, for example, a hafnium (Hf) precursor or an aluminum (Al) precursor. The hafnium precursor may include, for example, tetrakis-ethyl methyl amino hafnium (TEMAH; $Hf[NC_2H_5CH_3]_4$) or hafnium butyl oxide ($Hf(O-tBu)_4$). The hafnium precursor may include a mixture of, for example, TEMAH and hafnium butyl oxide. The aluminum precursor may include, for example, trimethyl aluminum (TMA; $Al(CH_3)_3$). Although the second reactant has been described herein as a hafnium or aluminum precursor, it will be understood that any suitable precursor may be used. The second reactant may have a gas phase through the use of a bubbler, or any suitable apparatus for providing the second reactant in a gas phase. The second reaction gas may be provided onto the first thin film 2000 for about 0.5 seconds to about 3 seconds, inclusive.

Figure 11G:
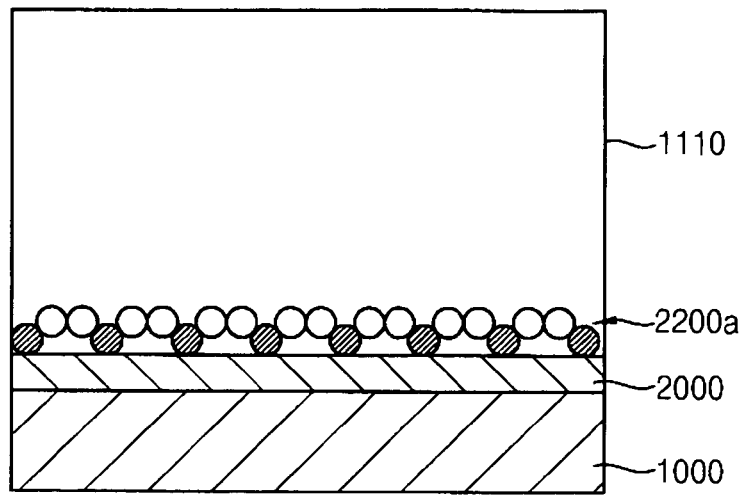

Referring to FIG. 11G, a third gas (e.g., a third purge gas) may be introduced into the chamber 1110 and may remove a drifting second portion 2320 of the second reactant and the physically absorbed second portion 2300 of the second reactant, and the chemisorbed first portion 2200 of the second reactant may remain on the first thin film 2000. The remaining first portion 2200 of the second reactant may correspond to precursor molecules 2200a.

Figure 11H:
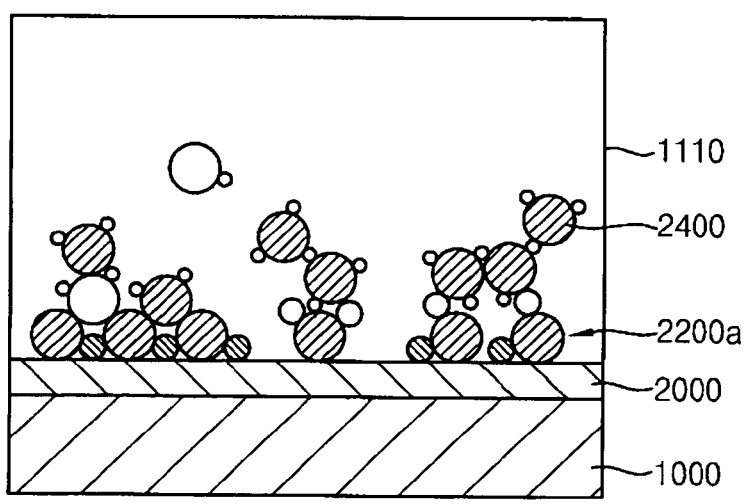

Referring to FIG. 11H, an oxidant 2400 may be provided on the chemisorbed first portion 2200 of the second reactant. The oxidant 2400 may be introduced into the chamber 1110 for the same, or substantially the same, time as the oxidant 1400. The oxidant 2400 may include the same, or substantially the same, gases and/or plasmas as the oxidant 1400.

When the oxidant 2400 is provided onto the chemisorbed first portion 2200 of the second reactant, the oxidant 2400 may be chemically reacted with the chemisorbed first portion 2200 of the second reactant, for example, the oxidant 2400 may oxidize the precursor molecules 2200a. When the second reactant includes the hafnium precursor, the precursor molecules 2200a may be hafnium precursor molecules. When the second reactant includes the aluminum precursor, the precursor molecules 2200a may be aluminum precursor molecules.

Figure 11I:
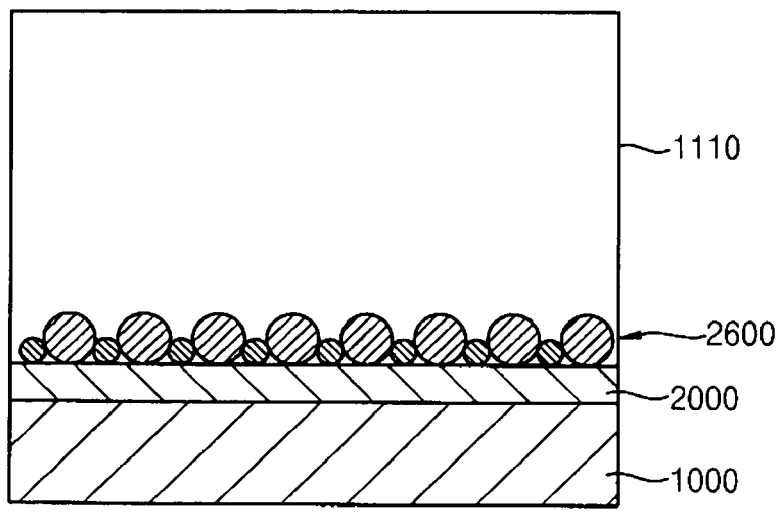

Referring to FIG. 11I, a fourth gas (e.g., a fourth purge gas) may be introduced into the chamber 1110 for about 0.5 seconds to about 20 seconds, inclusive, and may remove a remaining portion of the oxidant 2400, which may not chemically react with the chemisorbed first portion 2200 of the second reactant. The fourth gas may include an inert (or inactive) gas, for example, an argon (Ar) gas or a nitrogen ($N_2$) gas. When the unreacted oxidant 2400 is removed from the chamber 1110, a second solid-phased material 2600 may be formed on the first thin film 2000. The second solid-phased material (e.g., metal oxide material) 2600 may include, for example, hafnium oxide or aluminum oxide. Although the second solid-phased material (e.g., metal oxide material) 2600 has been described herein as hafnium oxide or aluminum oxide, it will be understood that any suitable metal oxide material may used.

Figure 11J:
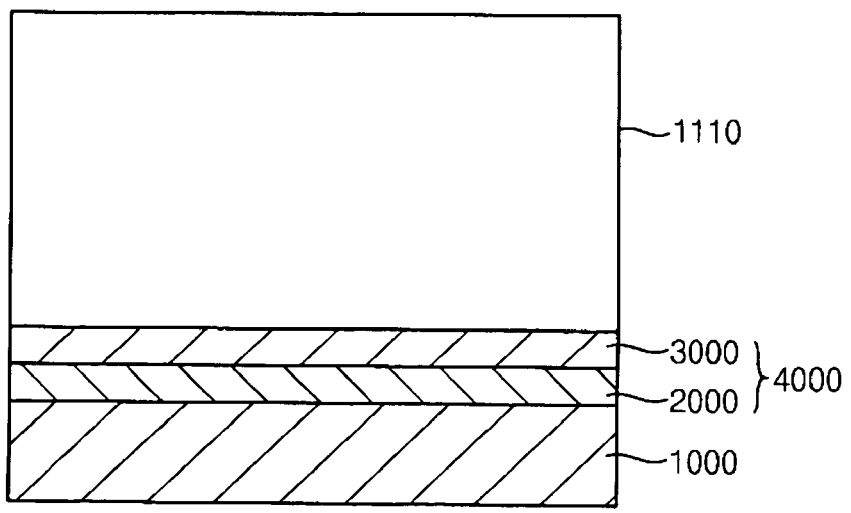

Referring to FIG. 11J, the process as described with reference to FIGS. 11F to 11I may be repeated at least once so that a second thin film 3000 including the second solid-phased material (e.g., metal oxide material) 2600 may be formed on the first thin film 2000. The second thin film 3000 may include, for example, hafnium oxide or aluminum oxide. As a result, the thin film structure 4000, which may have the first thin film 2000 and the second thin film 3000, may be formed on the substrate 1000.

The thin film structure 4000 may have the first thin film 2000 including, for example, zirconium oxide and the second thin film 3000 including, for example, hafnium oxide or aluminum oxide. When the second thin film 3000 includes hafnium oxide, the second thin film 3000 may sufficiently suppress, (e.g., prevent) crystallization of the first thin film 2000 because the second thin film 3000 may have a higher crystalline temperature of, for example, greater than about 500° C. When the second thin film 3000 includes aluminum oxide, the second thin film 3000 may suppress (e.g., prevent) crystallization of the first thin film 2000 because the second thin film 3000 may have a higher crystalline temperature of greater than about 600° C. The thin film structure 4000 may have a higher dielectric constant and/or a higher crystalline temperature because the first thin film 2000 may provide the higher dielectric constant and/or a thin equivalent oxide thickness (EOT) and the second thin film 3000 may provide the higher crystalline temperature. The thin film structure 4000 may include the first thin film 2000 having a first thickness and the second thin film 3000 having a second thickness. The thin film structure may have a double-layered structure in which the first thin film 2000 and the second thin film 3000 may be formed (e.g., sequentially formed) on the substrate 1000. When the double-layered thin film structure 4000 is utilized in a dielectric layer of a capacitor, the first thin film 2000 may have a first thickness of about 50 Å to about 150 Å, inclusive, and the second thin film 3000 may have a second thickness of about 1 Å to about 30 Å, inclusive. When the second thin film 3000 includes hafnium oxide, the second thickness may be in a range of about 1 Å to about 30 Å, inclusive. The second thin film 3000 may have the second thickness of about 1 Å to about 20 Å, inclusive, when the second thin film 3000 may include, for example, aluminum oxide.

Figure 13:
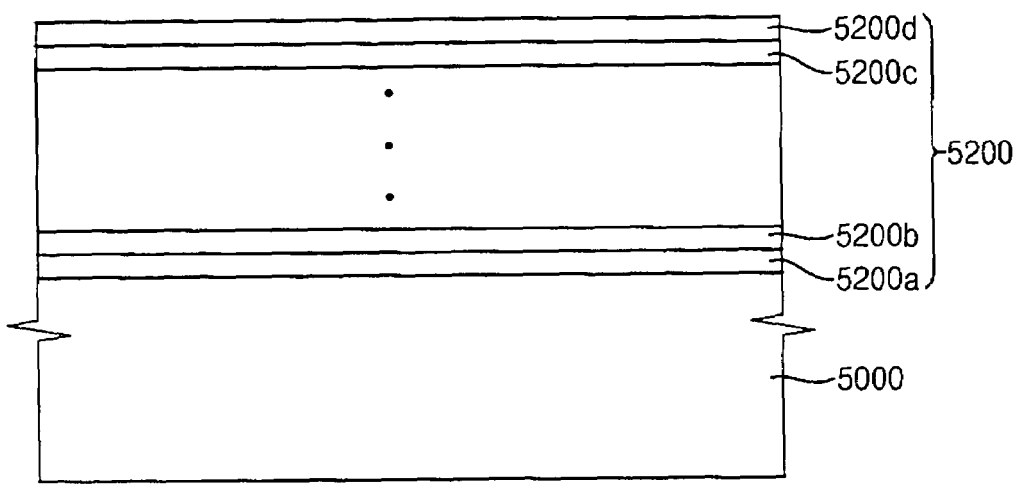
FIG. 13 is a cross-sectional view illustrating a thin film structure in accordance with another example embodiment of the present invention.

FIG. 13 is a cross sectional view illustrating a thin film structure in accordance with another exemplary embodiment of the present invention.

Referring to FIG. 13, a first thin film 5200a may be formed on a substrate 5000 through the same, or substantially the same, process as described with reference to FIGS. 11A to 11D. A second thin film 5200b may be formed on the first thin film 52a by the same, or substantially the same, process as described with reference to FIGS. 11F to 11I. The first thin film 5200a may include, for example, zirconium oxide and the second thin film 5200b may include, for example, hafnium oxide or aluminum oxide. However, the first thin film 5200a and the second thin film 5200b may be any suitable metal oxide material.

When forming additional first thin films 5200c and second thin films 5200d, a thin film structure 5200, which may include a plurality of first thin films 5200a and 5200c and a plurality of second thin films 5200b and 5200d, may be formed on the substrate 1000. All, or substantially all, of the first thin films 5200a and 5200c may be formed by the same, or substantially the same, process as described with reference to FIGS. 11A to 11D. All, or substantially all, of the second thin films 5200b and 5200d may be formed using the same, or substantially the same, process as described with reference to FIGS. 11F to 11I.

The thin film structure 5200 may have a laminated structure in which a plurality of first thin films 5200a and 5200c and a plurality second thin films 5200b and 5200d may be formed (e.g., alternately formed) on the substrate 5000. When the thin film structure 5200 with a laminated structure is included in a dielectric layer of a capacitor, all, or substantially all, of the thickness of the first thin films 5200a and 5200c may be in a range of about 50 Å to about 150 Å, inclusive, and all, or substantially all, of the thickness of the second thin films 5200b and 5200d may be about 1 Å to about 30 Å, inclusive. For example, the entire thickness of the second thin films 5200b and 5200d may be about 1 Å to about 30 Å when the second thin films 5200b and 5200d include hafnium oxides. In another example embodiment of the present invention, the second thin films 5200b and 5200d may include aluminum oxides, and the entire thickness of the second thin films 5200b and 5200d may be in a range of about 1 Å to about 20 Å.

The first thin films 5200a and 5200c may have a different thickness in accordance with the number of repetitions of the process for forming the first thin films 5200a and 5200c. Each of the second thin films 5200b and 5200d may have a different thickness in accordance with the number of cycles of the processing steps for forming the second thin films 5200b and 5200d.

Figure 14:
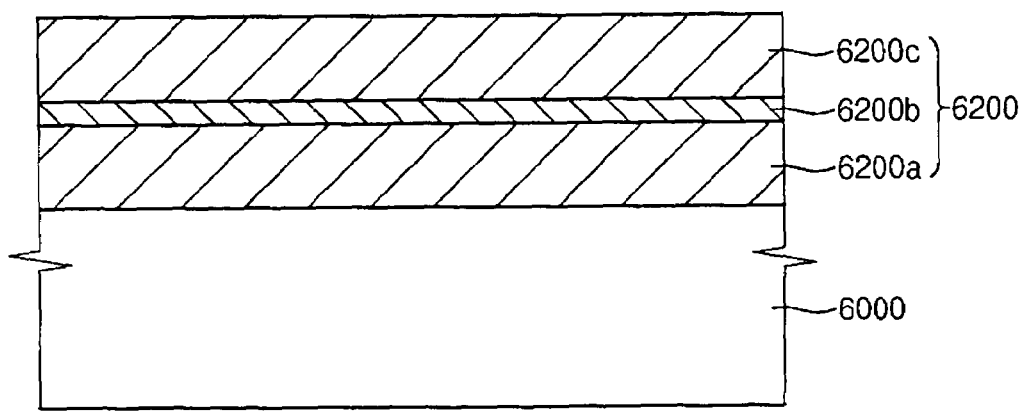
FIG. 14 is a cross-sectional view illustrating a thin film structure in accordance with another example embodiment of the present invention.

FIG. 14 is a cross sectional view illustrating a thin film structure in accordance with another example embodiment of the present invention.

Referring to FIG. 14, a first thin film 6200a may be formed on a substrate 6000 by the same, or substantially the same, process as described with reference to FIGS. 11A to 11D. A second thin film 6200b may be formed on the first thin film 5200a by the same, or substantially the same, process as described with reference to FIGS. 11 F to 11I. An additional first thin film 6200c may be formed on the second thin film 6200b using the same, or substantially the same process as used in forming the first thin film 6200a. The first thin film 6200a may include zirconium oxide, and the additional first thin film 6200c may also include zirconium oxide. However, the first thin films 6200a and/or 6200c may be any suitable metal oxide material. The second thin film 6200b may include hafnium oxide, aluminum oxide, or any other suitable metal oxide material. A thin film structure 6200 may have a sandwich structure in which the second thin film 6200b may be interposed between the first thin film 6200a and the additional first thin film 6200c.

When the thin film structure 6200 having such as structure is included in a dielectric layer of a capacitor, all, or substantially all, of the thickness of the first thin film 6200a and the additional first thin film 6200c may be about 50 Å to about 150 Å, inclusive, and a thickness of the second thin film 6200b may be in a range of about 1 Å to about 30 Å, inclusive. For example, the second thin film 6200b may include hafnium oxide, and the thickness of the second thin film 6200b may be about 1 Å to about 30 Å, inclusive. In another example, when the second thin film 6200b may include aluminum oxide, and the thickness of the second thin film 6200b may be about 1 Å to about 20 Å, inclusive.

In an example embodiment of the present invention, a thin film structure may have another sandwich structure in which a first thin film including zirconium oxide may be interposed between two of second thin films, which may include, for example, hafnium oxides or aluminum oxide. However, the first and second thin films may be any suitable metal oxide material.

FIGS. 15A to 15E are cross sectional views illustrating a method of forming a capacitor in accordance with another example embodiment of the present invention.

Figure 15A:
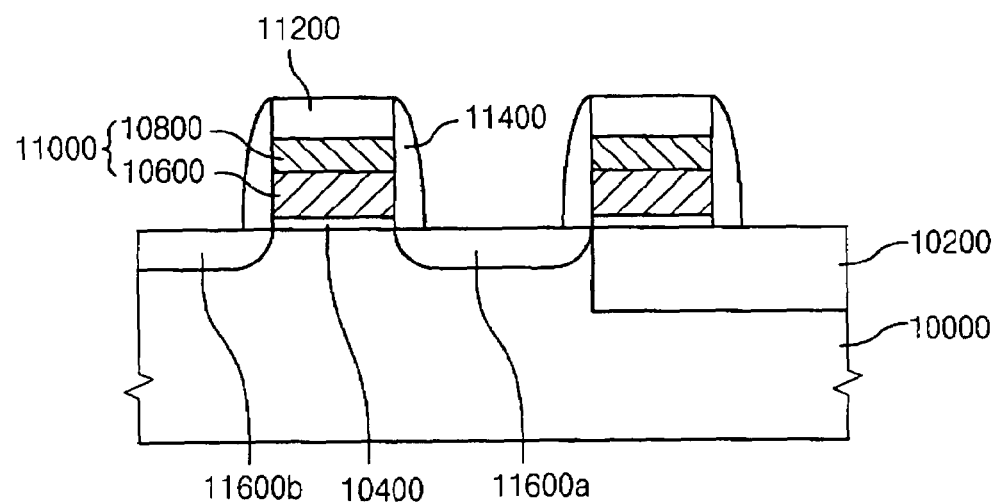
FIGS. 15A to 15E are cross sectional views illustrating a method of forming a capacitor in accordance with another example embodiment of the present invention.

Referring to FIG. 15A, an active region and a field region 10200 may be formed on a substrate (e.g., semiconductor substrate) 1000, for example, through an isolation process such as a shallow trench isolation (STI) process, although any suitable process may be used.

A gate insulation layer pattern 10400 and a gate electrode 11000 may be formed on the substrate 1000. The gate electrode 11000 may include, for example, a polysilicon layer pattern 10600 and a metal silicide layer pattern 10800.

A capping layer pattern 11200 may be formed on the gate electrode 11000. The capping layer pattern 11200 may include, for example, an oxide such as silicon oxide or a nitride such as silicon nitride, however, any suitable oxide or nitride may be used.

Source/drain regions 11600a and 11600b may be formed at portions of the active regions, which may be adjacent to the gate electrode 11000. The source/drain regions 11600a and 11600b may be formed, for example, by implanting impurities into the portions of the active region using, for example, the gate electrode 11000 as an implantation mask.

A spacer 11400 may be formed on sidewalls of the gate electrode 11000 and the capping layer pattern 11200. The spacer 11400 may be formed using a nitride such as silicon nitride, however, any suitable nitride may be used.

Figure 15B:
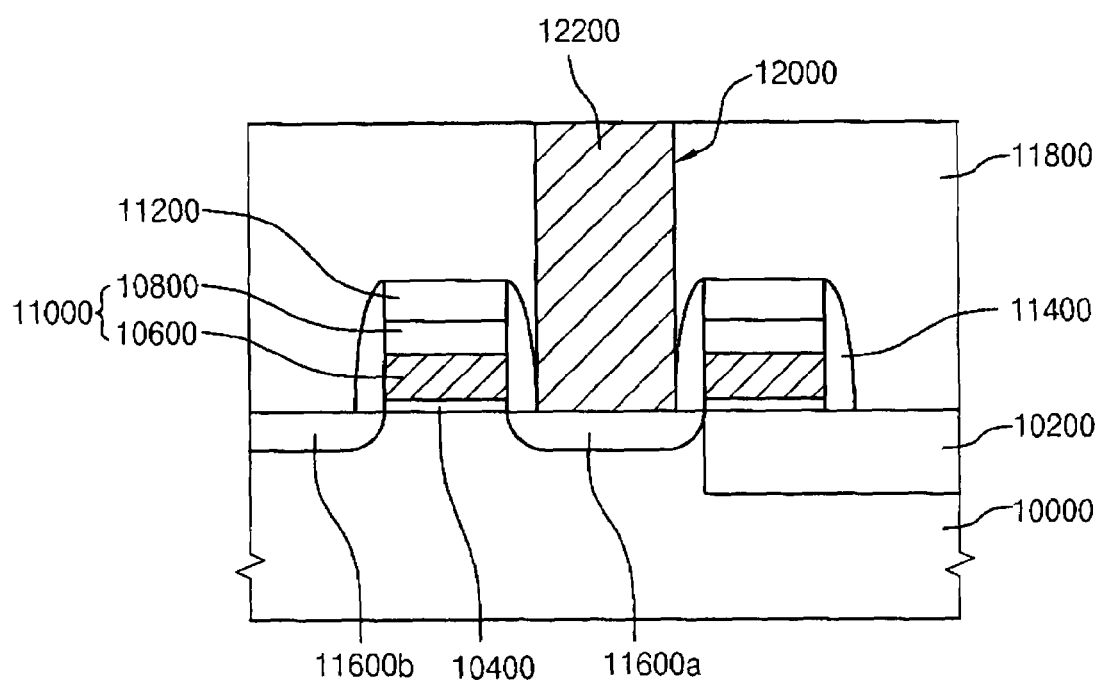

Referring to FIG. 15B, a first insulation layer 11800 may be formed on the substrate 1000, and may cover the capping layer pattern 11200 positioned on the gate electrode 11000. The first insulation layer 11800 may be formed using oxide, however, any suitable insulating material may be used.

The first insulation layer 11800 may be etched (e.g., partially etched) to form a first contact hole 12000, which may expose (e.g., partially expose) the source/drain regions 11600a and 11600b.

A first conductive layer may be formed on the first insulation layer 11800 and may fill (e.g., sufficiently fill) the first contact hole 12000. The first conductive layer may include a conductive material such as doped polysilicon, metal, or any suitable conductive material.

The first conductive layer may be removed by, for example, a chemical mechanical polishing (CMP) process, an etch back process or a combination process of CMP and etch back until the first insulation layer 11800 may be exposed. A plug (e.g., a contact plug) 12200 may be formed in the first contact hole 12000. The plug 12200 may contact (e.g., electrically contact) the source/drain regions 11600a and 11600b.

Figure 15C:
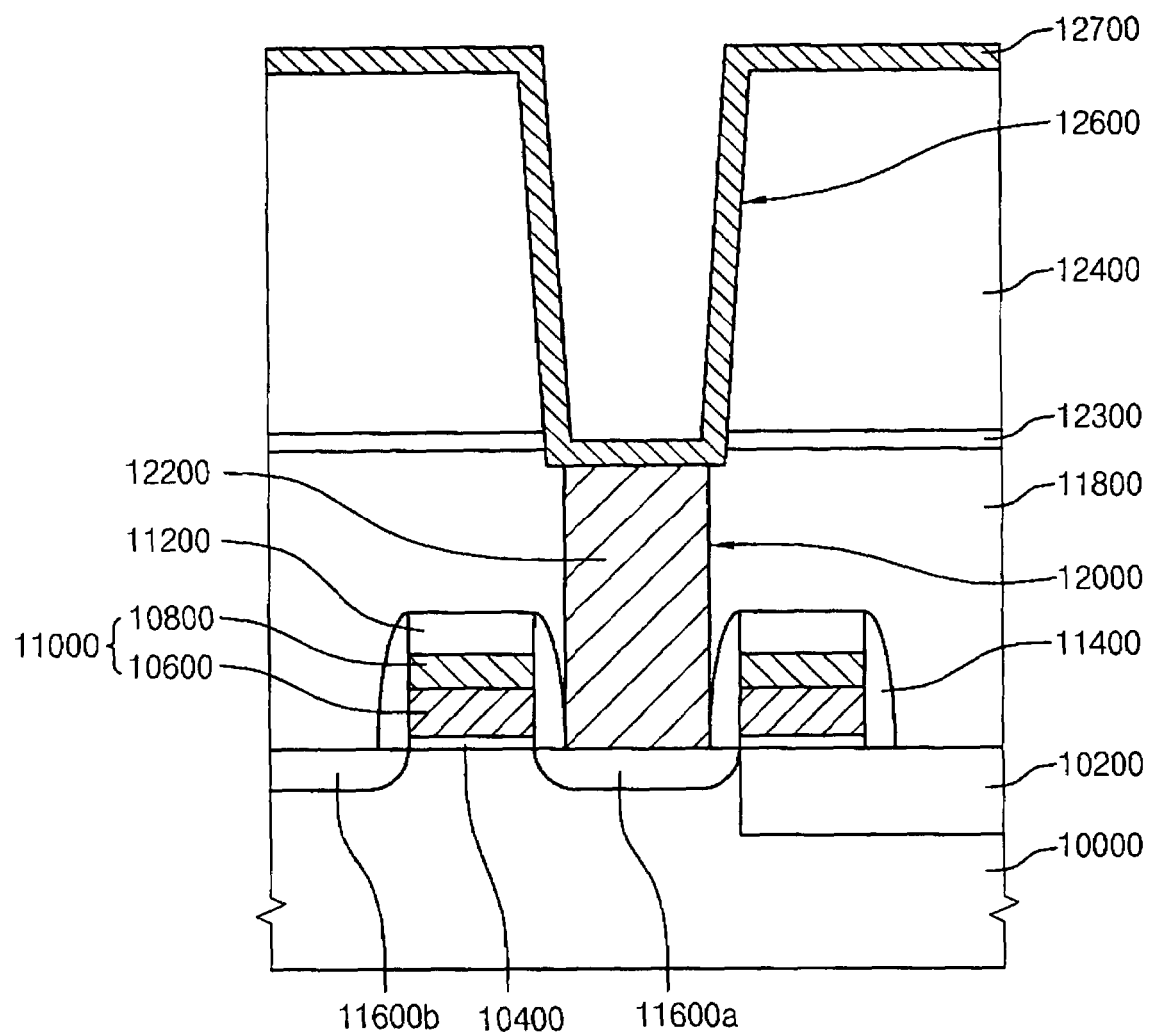

Referring to FIG. 15C, an etch stop layer 12300 may be formed on the plug 12200 and the first insulation layer 11800. The etch stop layer 12300 may include a material having an etch rate higher, or substantially higher, than that of the first insulation layer 11800. For example, the etch stop layer 12300 may include a nitride such as silicon nitride, an oxynitride such as silicon oxynitride, or any other suitable nitride or oxynitride.

A second insulation layer 12400 may be formed on the etch stop layer 12300. The second insulation layer 12400 may include an oxide. The second insulation layer 12400 and the etch stop layer 12300 may be partially etched to form a second contact hole 12600 which may expose the plug 12200. When the second contact hole 12600 is formed, the second insulation layer 12400 may be etched to expose, for example, a portion of the etch stop layer 12300. The exposed portion of the etch stop layer 12300 may be etched, which may form the second contact hole 12600 through the second insulation layer 12400 and the etch stop layer 12300. The second contact hole 12600 may have a lower portion and an upper portion. A rate of etching the second insulation layer 12400 may decrease (e.g., gradually decrease) from the etching of the upper portion of the second insulation layer 12400 to the lower portion of the second insulation layer 12400, and the upper portion may have a diameter larger, or substantially larger, than that of the lower portion.

A second conductive layer 12700 may be formed on the second insulation layer 12400, the exposed contact plug 12200, and an inside of the second contact hole 12600. The second conductive layer 12700 may include a conductive material such as titanium nitride (TiN), ruthenium (Ru), tantalum nitride (TaN), tungsten nitride (WN), a mixture thereof, or any suitable conductive material. The second conductive layer may include titanium nitride, for example, when a first thin film 13000a of a dielectric layer 13000 includes zirconium oxide.

Figure 15D:
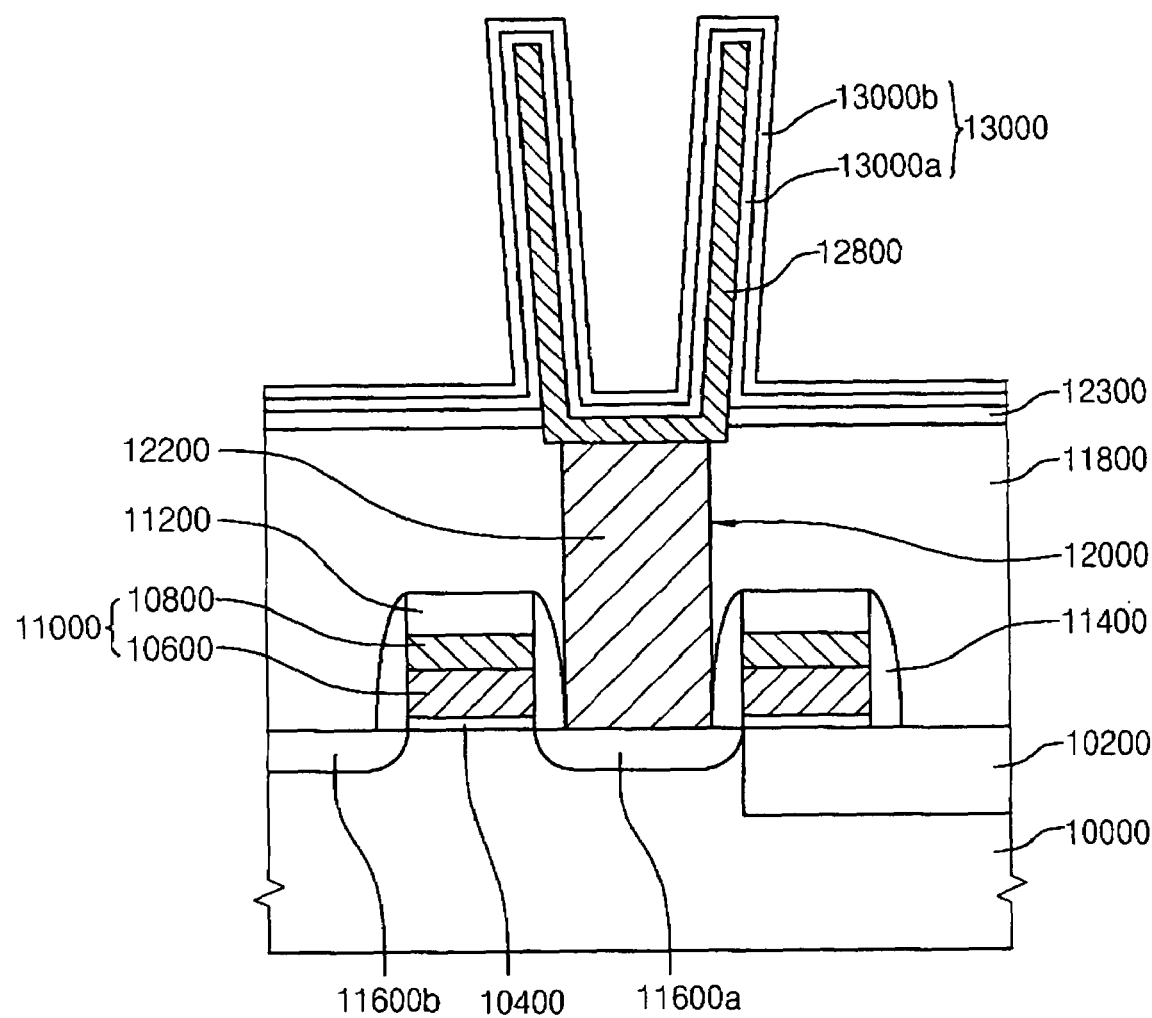

Referring to FIG. 15D, a sacrificial layer (not shown) may be formed on the second conductive layer 12700 to fill the second contact hole 12600, and the sacrificial layer and the second conductive layer 12700 may be removed (e.g., partially removed), for example, until the second insulation layer 12400 may be exposed. A lower electrode 12800 may be formed on the inside of the second contact hole 12600 and the exposed portion of the plug 12200. A sacrificial layer pattern filling the second contact hole 12600 may be formed on the lower electrode 12800. The sacrificial layer pattern may be removed, which may create the lower electrode 12800 contacting the plug 12200. The lower electrode 12800 may have, for example, a cylindrical structure of which an upper diameter may be larger, or substantially larger, than a lower diameter, however, any suitable structure and/or diameter may be used. For example, the lower electrode 12800 may have a height of about 10,000 Å to about 17,000 Å, inclusive.

The dielectric layer 13000 having a double-layered structure may be formed on the lower electrode 12800. The dielectric layer 13000 may include the first thin film 13000a having a higher dielectric constant and a second thin film 13000b having a higher crystalline temperature. The first thin film 13000a may include, for example, zirconium oxide and the second thin film 13000b may include, for example, hafnium oxide or aluminum oxide. The second thin film 13000b may suppress (e.g., prevent) the first thin film 13000a from crystallizing. The first and second thin films 13000a and 13000b may be formed through processing steps identical, or substantially identical, to those described above.

As described above, the dielectric layer 13000 may have a laminated structure that includes a plurality of first thin films and a plurality of second thin films alternately formed on a lower electrode. Alternatively, the dielectric layer 13000 may have a sandwich structure in which a first thin film may be formed between two of second thin films, or a second thin film may be interposed between two of first thin films.

The first thin film 13000a of the dielectric layer 13000 may have a first thickness of about 50 Å to about 150 Å, inclusive, and the second thin film 13000b of the dielectric layer 13000 may have a second thickness of about 1 Å to about 30 Å, inclusive. When the second thin film 13000b includes hafnium oxide, the second thin film 13000b has the second thickness of about 1 Å to about 30 Å. Otherwise, the second thin film 13000b may have the second thickness of about 1 Å to about 20 Å, inclusive, when the second thin film 13000b includes, for example, aluminum oxide.

When the second thin film 13000b includes hafnium oxide, the second thin film 13000b of hafnium oxide may have, for example, a thickness thinner, or substantially thinner, than that of the second thin film 13000b of aluminum oxide because aluminum oxide has a dielectric constant lower, or substantially lower than that of hafnium oxide. A capacitance of a capacitor C may be in inverse proportion to the thickness of the dielectric layer 13000, the capacitor C may have a constant capacitance by adjusting, for example, the second thickness of the second thin film 13000b.

The dielectric layer 13000 may include the first thin film 10300a and the second thin film 13000b, and the capacitor C may have a sufficient capacitance due to the first thin film 13000a having the higher dielectric constant. A crystallization of the dielectric layer 13000 may be suppressed (e.g., prevented) by the second thin film 13000b having the higher crystalline temperature for reducing (e.g., preventing) the first thin film 13000a from crystallizing. Successive processes for forming the capacitor C may be more easily carried out while suppressing (e.g., preventing), damage to the dielectric layer 13000. Although the successive processes may be performed at higher temperatures of about 500° C. to about 600° C., inclusive, the dielectric layer 13000 may not be crystallized due to the second thin film 13000b.

Figure 15E:
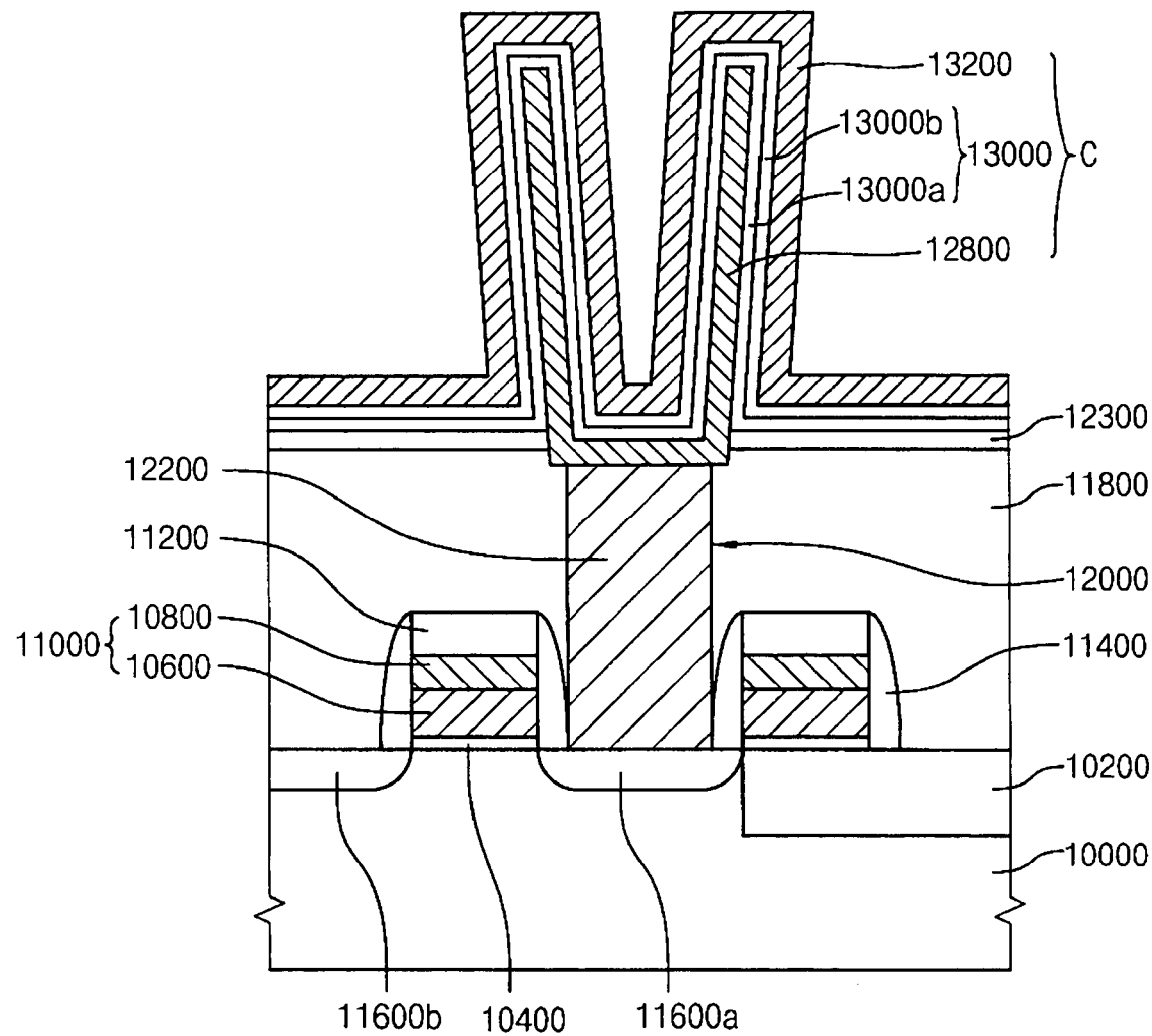

Referring to FIG. 15E, the dielectric layer 13000 including the first and second thin films 13000a and 13000b may be formed on the lower electrode 12800, and the dielectric layer 13000 may be thermally treated to cure the dielectric layer 13000 and to remove impurities contained in the dielectric layer 13000. For example, the dielectric layer 13000 may be thermally treated using an ultra violet ray, an ozone gas or plasma. The dielectric layer 13000 may include the second thin film 10300b, and the dielectric layer 13000 may be thermally treated without crystallization thereof.

An upper electrode 13200 may be formed on the dielectric layer 13000 to form the capacitor C including the lower electrode 12800, the dielectric layer 13000 and the upper electrode 13200 over the substrate 1000. The upper electrode 13200 may include a conductive material such as doped polysilicon, metal or metal nitride. For example, the upper electrode 13200 may include titanium nitride (TiN), ruthenium (Ru), tantalum nitride (TaN), tungsten nitride (WN) or a mixture thereof. When the second thin film 13000b of the dielectric layer 13000, the upper electrode 13200 may include titanium nitride.

The dielectric layer 13000 may include the first thin film 13000a of zirconium oxide and the second thin film 13000b of hafnium oxide or aluminum oxide. The dielectric layer 10300 may have a higher dielectric constant and/or a higher crystalline temperature.

In an example embodiment of the present invention, a dielectric layer of a capacitor may have a laminated structure in which a plurality of first thin films and a plurality of second thin films may be formed, (e.g., alternately formed) on a lower electrode of the capacitor.

In an exemplary embodiment of the present invention, a dielectric layer of a capacitor may have a sandwich structure in which a second thin film may be formed between two of first thin films or a first thin films may be disposed between two of second thin films.

Although exemplary embodiments of the present invention have been discussed with regard to specific temperature, pressure, and/or layer thickness ranges, it will be understood that any suitable temperature, pressure, and/or layer thickness may be used.

According to the present invention, a film structure having a higher dielectric constant and/or a higher crystalline temperature may be more easily manufactured. When the thin film structure may be employed for a dielectric layer of a capacitor, the dielectric layer may also have a higher dielectric constant and a higher crystalline temperature. The capacitor may, thus, have improved electrical characteristics and/or enhanced reliability.

Although exemplary embodiments of the present invention have been described, it is understood that the present invention should not be limited to these example embodiments but various changes and modifications can be made by one skilled in the art within the spirit and scope of the present invention as hereinafter claimed.

What is claimed is:

1. A method of forming a thin film structure, the method comprising:

forming at least one first thin film including a metal oxide material on a substrate using a first reactant including a precursor and using a first oxidant for oxidizing the first reactant, the first reactant including at least one of tetrakis-methyl ethyl amino zirconium (TEMAZ) and zirconium butyl oxide; and forming at least one second thin film on the at least one first thin film to suppress crystallization of the first thin film.

2. The method of claim 1, wherein the metal oxide material is zirconium oxide, and the precursor is a zirconium precursor.

3. The method of claim 1, wherein one first thin film is formed and the method of forming the first thin film further includes, providing the first reactant on the substrate, chemisorbing a first portion of the first reactant to the substrate and physically absorbing a second portion of the first reactant to the chemisorbed first portion of the first reactant, removing the second portion of the first reactant, providing the first oxidant on the substrate, the first oxidant including at least one of an ozone ($O_3$) gas, an oxygen ($O_2$) gas, a water ($H_2O$) vapor, an oxygen plasma and a remote oxygen plasma, forming the first metal oxide material on the substrate by chemically reacting the first portion of the first reactant with the first oxidant, and removing an unreacted first oxidant.

4. The method of claim 3, wherein providing the first reactant, chemisorbing the first portion of the first reactant, physically absorbing the second portion of the first reactant, removing the second portion of the first reactant, providing the first oxidant, forming the first metal oxide material and removing the unreacted first oxidant are repeated at least once.

5. The method of claim 1, wherein the at least one first thin film is formed at a temperature of about 200° C. to about 400° C., inclusive.

6. The method of claim 1, wherein the at least one first thin film is formed at a pressure of about 0.1 Torr to about 3.0 Torr, inclusive.

7. The method of claim 1, wherein the at least one second thin film includes a metal oxide material.

8. The method of claim 7, wherein the at least one second thin film includes at least one of hafnium oxide and aluminum oxide.

9. The method of claim 1, wherein the at least one second thin film is formed at at least one of a temperature of about 200° C. to about 400° C., inclusive, and a pressure of about 0.1 Torr to about 3.0 Torr, inclusive.

10. The method of claim 1, wherein the thin film structure has a double-layered structure in which the at least one first thin film has a first thickness and the at least one second thin film has a second thickness.

11. The method of claim 1, wherein the thin film structure has a laminated structure in which a plurality of first thin films and a plurality of second thin films are alternately stacked.

12. The method of claim 1, wherein the thin film structure has a structure in which the second thin film is interposed between two first thin films or the first thin film is interposed between two second thin films.

13. A method of forming a thin film structure, the method comprising:
forming at least one first thin film including a metal oxide material on a substrate using a first reactant including a precursor and using a first oxidant for oxidizing the first reactant; and
forming at least one second thin film on the at least one first thin film to suppress crystallization of the first thin film; wherein
one second thin film is formed, the second thin film includes hafnium oxide, and the method of forming the second thin film further includes,
providing a second reactant on the first thin film, the second reactant including at least one of tetrakis-ethyl methyl amino hafnium and hafnium butyl oxide,
chemisorbing a first portion of the second reactant to the first film and physically absorbing a second portion of the second reactant to the chemisorbed first portion of the second reactant,
removing the second portion of the second reactant,
providing a second oxidant on the substrate, the second oxidant including at least one of an ozone ($O_3$) gas, an oxygen ($O_2$) gas, a water ($H_2O$) vapor, an oxygen plasma and a remote oxygen plasma,
forming the second metal oxide material on the first thin film by chemically reacting the first portion of the second reactant with the second oxidant, and
removing an unreacted second oxidant.

14. The method of claim 13, wherein providing the second reactant, chemisorbing the first portion of the second reactant, physically absorbing the second portion of the second reactant, removing the second portion of the second reactant, providing the second oxidant, forming the second metal oxide material and removing the unreacted second oxidant are repeated at least once.

15. The method of claim 13, wherein the at least one second thin film is formed at at least one of a temperature of about 200° C. to about 400° C., inclusive, and a pressure of about 0.1 Torr to about 3.0 Torr, inclusive.

16. A method of forming a thin film structure, the method comprising:
forming at least one first thin film including a metal oxide material on a substrate using a first reactant including a precursor and using a first oxidant for oxidizing the first reactant; and
forming at least one second thin film on the at least one first thin film to suppress crystallization of the first thin film; wherein
one second thin film is formed, the second thin film includes aluminum oxide and forming the second thin film includes,
providing a second reactant on the at least one first thin film, the second reactant including trimethyl aluminum (TMA),
chemisorbing a first portion of the second reactant to the first film and physically absorbing a second portion of the second reactant to the chemisorbed first portion of the second reactant,
removing the second portion of the second reactant,
providing a second oxidant on the substrate, the second oxidant including at least one of an ozone ($O_3$) gas, an oxygen ($O_2$) gas, a water ($H_2O$) vapor, an oxygen plasma and a remote oxygen plasma,
forming the second metal oxide material on the first thin film by chemically reacting the first portion of the second reactant with the second oxidant, and
removing an unreacted second oxidant.

17. The method of claim 16, wherein the second thin film is formed at at least one of a temperature of about 200° C. to about 400° C., inclusive, and a pressure of about 1.0 Torr to about 3.0 Torr, inclusive.

18. The method of claim 16, wherein providing the second reactant, chemisorbing the first portion of the second reactant, physically absorbing the second portion of the second reactant, removing the second portion of the second reactant, providing the second oxidant, forming the second metal oxide material and removing the unreacted second oxidant are repeated at least once.

19. A method of forming a capacitor, the method comprising:
forming a lower electrode on a substrate;
forming a dielectric layer including a thin film structure formed using the method of claim 1; and
forming an upper electrode on the dielectric layer.

20. The method of claim 19, wherein the at least one first thin film includes zirconium oxide.

21. The method of claim 19, wherein the dielectric layer includes one first thin film and one second thin film and the method of forming the dielectric layer further includes,
providing a first reactant on the lower electrode,
chemisorbing a first portion of the first reactant to the lower electrode and physically absorbing a second portion of the first reactant to the chemisorbed first portion of the first reactant,
removing the second portion of the first reactant,
providing a first oxidant on the chemisorbed first portion of the first reactant,
forming a first thin film on the lower electrode by chemically reacting the first oxidant with the chemisorbed first portion of the first reactant;
removing an unreacted first oxidant,
providing a second reactant on the first thin film,
chemisorbing a first portion of the second reactant to the first thin film and physically absorbing a second portion of the second reactant to the chemisorbed first portion of the second reactant,
removing the second portion of the second reactant;
providing a second oxidant on the chemisorbed first portion of the second reactant,
forming a second thin film on the first thin film by chemically reacting the second oxidant with the chemisorbed first portion of the second reactant, and
removing an unreacted second oxidant.

22. The method of claim 21, wherein the second reactant includes at least one of a hafnium precursor and an aluminum precursor.

23. The method of claim 22, wherein the hafnium precursor includes at least one of TEMAH and hafnium butyl oxide, and the aluminum precursor includes TMA.

24. The method of claim 21, wherein the second thin film includes at least one of a hafnium oxide and an aluminum oxide.

25. The method of claim 21, wherein the first oxidant includes one of an ozone gas, an oxygen gas, a water vapor, an oxygen plasma and a remote oxygen plasma, and the second oxidant includes one of an ozone gas, an oxygen gas, a water vapor, an oxygen plasma and a remote oxygen plasma.

26. The method of claim 21, wherein providing the first reactant, chemisorbing the first portion of the first reaction, physically absorbing the second portion of the first reactant, removing the second portion of the first reactant, providing the first oxidant, forming the first thin film, and removing the unreacted first oxidant are performed at least once.

27. The method of claim 21, wherein providing the second reactant, chemisorbing the first portion of the second reactant, physically absorbing the second portion of the second reactant, removing the second portion of the second reactant, providing the second oxidant, forming the second thin film, and removing the unreacted second oxidant are performed at least once.

28. The method of claim 21, wherein providing the first reactant, chemisorbing the first portion of the first reaction, physically absorbing the second portion of the first reactant, removing the second portion of the first reactant, providing the first oxidant, forming the first thin film, removing the unreacted first oxidant, providing the second reactant, chemisorbing the first portion of the second reactant, physically absorbing the second portion of the second reactant, removing the second portion of the second reactant, providing the second oxidant, forming the second thin film, and removing the unreacted second oxidant are performed at least once.

29. The method of claim 19, wherein the dielectric layer is formed at at least one of a temperature of about 200° C. to about 400° C., inclusive, and a pressure of about 0.1 Torr to about 3.0 Torr, inclusive.

30. The method of claim 19, wherein the at least one first thin film has a thickness of about 50 Å to about 150 Å, inclusive, and the at least one second thin film has a thickness of about 1 Å to about 30 Å, inclusive.

31. The method of claim 19, wherein the dielectric layer includes one first thin film and one second thin film, and has a double-layered structure in which the first thin film has a first thickness and the second thin film has a second thickness formed on the first thin film.

32. The method of claim 19, wherein the dielectric layer has a structure in which the second thin film is interposed between two first thin films or the first thin film is interposed between two second thin films.

33. The method of claim 19, wherein at least one of the lower electrode and the upper electrode includes titanium nitride.

34. The method of claim 19, wherein the dielectric layer has a laminated structure in which a plurality of first thin films and a plurality of second thin films are alternately stacked.

35. A thin film structure formed using the method of claim 1.

36. A capacitor formed using the method of claim 19.

37. A method of forming a thin film structure, the method comprising:

forming at least one first thin film including a metal oxide material on a substrate using a first reactant including a precursor and using a first oxidant for oxidizing the first reactant; and forming at least one second thin film on the at least one first thin film to suppress crystallization of the first thin film, the at least one second thin being formed using a second reactant, the second reactant including at least one of tetrakis-ethyl methyl amino hafnium and hafnium butyl oxide.

* * * * *